United States Patent [19]

Yoshida et al.

[11] Patent Number: 4,897,846
[45] Date of Patent: Jan. 30, 1990

[54] SURFACE EMISSION TYPE SEMICONDUCTOR LIGHT-EMITTING DEVICE

[75] Inventors: Tomoaki Yoshida, Sendai; Fumio Inaba, 1-13-1, Yagiyama-minami, Sendai-shi, Miyagi-ken; Hiromasa Ito, 390-82, Aza-aoba, Aramaki, Sendai-shi, Miyagi-ken; Tetsuro Saito, Sendai; Shiro Sato, Ogawara; Junichi Azumi, Sendai, all of Japan

[73] Assignees: Fumio Inaba; Hiromasa Ito, both of Sendai; Ricoh Company, Tokyo, all of Japan

[21] Appl. No.: 163,770

[22] Filed: Mar. 3, 1988

[30] Foreign Application Priority Data

Mar. 3, 1987 [JP] Japan .................................. 62-46683
Jun. 25, 1987 [JP] Japan ................................. 62-156615
Oct. 22, 1987 [JP] Japan ................................. 62-265220
Jan. 13, 1988 [JP] Japan ..................................... 63-3862

[51] Int. Cl.$^4$ ............................................... H01S 3/19
[52] U.S. Cl. ......................................... 372/46; 357/17; 372/108
[58] Field of Search ...................... 357/16, 17; 372/44, 372/45, 46, 108, 50

[56] References Cited

U.S. PATENT DOCUMENTS

| 4,660,207 | 4/1987 | Svilans | 372/46 |
| 4,675,875 | 6/1987 | Takamiya | 372/46 |
| 4,675,876 | 6/1987 | Svilans | 372/46 |
| 4,675,877 | 6/1987 | Svilans | 372/46 |
| 4,742,378 | 5/1988 | Ito et al. | 357/17 |

Primary Examiner—James W. Davie
Attorney, Agent, or Firm—Oblon, Spivak, McClelland, Maier & Neustadt

[57] ABSTRACT

A surface emission type semiconductor light-emitting device includes a base having a main surface, a current blocking layer formed on the base, and a semiconductor layer formed on the current blocking layer. A circular recess or hole having a side wall which is substantially perpendicular to the main surface is formed in the semiconductor layer as extending therethrough and partly into the base. An impurity is introduced into the semiconductor layer through the side wall and thus there is defined a cylindrical diffusion region around the recess. A p-n junction is defined at an outer boundary of the diffusion region and the p-n junction effectively defines a light-emitting activation region. An additional diffusion region may be formed in the semiconductor layer for narrowing a current path in the semiconductor layer. A second current blocking layer may be formed on top of the semiconductor layer. The semiconductor layer may have a multi-layer structure which may be constructed to provide a current confinement effect.

46 Claims, 21 Drawing Sheets

SURFACE EMISSION TYPE SEMICONDUCTOR LIGHT-EMITTING DEVICE

BACKGROUND OF THE INVENTION

1. Field of the Invention

This invention generally relates to a semiconductor light-emitting device and in particular to a surface emission type semiconductor light-emitting device capable of emitting light in a direction substantially perpendicular to the surface of a substrate.

2. Description of the Prior Art

A surface emission type semiconductor light-emitting device for emitting light in a direction perpendicular to the surface of a substrate is well known. Such a surface emission type semiconductor light-emitting device includes a CTJ type light-emitting device having a projection or pillar extending in a direction substantially perpendicular to the main surface of a semiconductor substrate, a Burrus type light-emitting device having an etched hole at the rear surface of a semiconductor substrate aligned in position with a light-emitting region, and a semiconductor laser having a pair of light-reflecting means at the top and bottom of an activation region.

As shown in FIG. 36, in the case of a CTJ type light-emitting device, a p-n junction is formed not only in the projection but also in the substrate so that the p-n junction in the projection extends vertically with respect to the main surface of the substrate, but the p-n junction in the substrate extends in parallel with the main surface of the substrate. Thus, when a large amount of drive current is injected, light is emitted not only from the vertical p-n junction formed in the projection, but also from the horizontal p-n junction formed in the substrate. For this reason, even if a large amount of drive current is injected, the light-emitting efficiency is not increased significantly in the vertical direction. In addition, since an activation region where recombination of holes and electrons takes place to emit light is formed inside of a columnar or pillar-like projection, heat tends to accumulate within the projection, which may adversely affect the light-emitting characteristic. In addition, because of the presence of a projection, the mechanical integrity of a CTJ type device is not so great.

As shown in FIG. 37, in the case of a Burrus type light-emitting device, a light-emitting activation layer is formed to extend in parallel with the surface of a substrate, and thus it is difficult to obtain a large light output in the direction perpendicular to the surface of the substrate. As a result, this type of light-emitting device is not suitable for a super luminescent operation and a laser oscillation. Also from the viewpoint of manufacture, since a hole must be etched in the rear surface of a substrate in positional registration with a P type diffusion region, difficulty is encountered. In addition, the hole to be etched is significantly large in size and as an example the diameter of a hole to be etched is required to be approximately ten times of the diameter of a light-emitting region, so that difficulty is encountered in obtaining an increased density when arranging a plurality of this type of light-emitting devices in the form of one or two dimensional array.

On the other hand, as shown in FIG. 38, in the case of a surface emission type semiconductor laser having a pair of light reflecting structures at the top and the bottom of an activation region, since the light reflecting structures are formed in the vicinity of the activation region, it is required to define a large hole in a substrate as a light output outlet. However, the provision of such a large hole would tend to reduce the mechanical integrity of the device as a whole. In addition, in this type of a semiconductor laser, a top electrode is arranged around the hole formed in the substrate, and the activation region cannot be formed elongated in the vertical direction, i.e., light output direction, so that current cannot be concentrated in the activation region. Thus, it cannot be hoped to obtain an enhanced current injection efficiency into the activation region. Under the condition, there remains a problem of incapability to lower the threshold current. Difficulty is also present in manufacturing this type of device because a hole must be formed in the substrate in positional alignment with a circular electrode disposed below the activation region.

Under the circumstances, there has been proposed a surface emission type light-emitting semiconductor device including a semiconductor layer formed on a substrate and formed with a hole having a p-n junction extending in parallel with the side wall of the hole and thus perpendicular to the surface of the substrate as disclosed in the U.S. patent application No. 06/946,324, filed Dec. 24, 1986, assigned to some of the assignees of the present application. In this case, since the p-n junction extends perpendicularly to the surface of the substrate, light may be output in the vertical direction.

SUMMARY OF THE INVENTION

In accordance with the principle of the present invention, there is provided a semiconductor light-emitting device which comprises a substrate having a main surface, a semiconductor layer formed on the main surface of the substrate and having a light-emitting region capable of emitting light in a direction substantially perpendicular to the main surface of the substrate and an electrode means for injecting current into the activation region. In the preferred embodiment, the semiconductor layer includes a p-n junction and the activation region is defined as a region for emitting light due to recombination of holes and electrons at and/or in the vicinity of the p-n junction defined in the semiconductor layer.

In accordance with one aspect of the present invention, a current blocking layer is formed as extending in a direction substantially in parallel with the main surface of the substrate and a recess is formed in the semiconductor layer such that the recess has a side wall which extends substantially perpendicularly to the main surface of the substrate. The p-n junction is formed mainly along the side wall of the recess so that the p-n junction also extends substantially perpendicularly to the main surface of the substrate. In one example, the semiconductor layer has a first conductivity type and an impurity having a second conductivity type is diffused into the semiconductor layer through the surface of the side wall of the recess to define the p-n junction along the side wall of the recess. In one embodiment, the recess is formed by etching the semiconductor layer in a cylindrical form, though the recess may take any other desired shape, such as rectangular or polygonal shape.

In accordance with another aspect of the present invention, a current path narrowing layer is also provided so as to cause the current to flow through the light-emitting activation region as much as possible so as to obtain an enhanced light output.

In accordance with a further aspect of the present invention, an electrically insulating layer is also provided to limit the flow of current so as to obtain a high current injection efficiency into the light-emitting activation region.

In accordance with a still further aspect of the present invention, a current confinement layer is also provided to cause current to be efficiently injected into the light-emitting activation region so as to obtain an enhanced light output.

It is therefore a primary object of the present invention to obviate the disadvantages of the prior art as described above and to provide an improved semiconductor light-emitting device.

Another object of the present invention is to provide an improved surface emission type semiconductor light-emitting device capable of emitting light substantially perpendicularly with respect to the surface of a substrate.

A further object of the present invention is to provide an improved surface emission type semiconductor light-emitting device having a high current injection efficiency into a light-emitting activation region.

A still further object of the present invention is to provide an improve surface emission type semiconductor light-emitting device high in light output and structural integrity and reliable in operation.

Other objects, advantages and novel features of the present invention will become apparent from the following detailed description of the invention when considered in conjunction with the accompanying drawings.

DESCRIPTION OF THE PREFERRED EMBODIMENTS

In accordance with a first aspect of the present invention, there is provided a surface emission type semiconductor light-emitting device which comprises a semiconductor substrate of a first conductivity type and having a main surface, a current blocking layer formed on the main surface of the substrate in a single layer or a multi-layer structure, a semiconductor layer having a second conductivity type opposite in polarity to the first conductivity type formed on the current blocking layer, and a cap layer having the second conductivity type formed on the semiconductor layer so as to ease formation of an electrode. The semiconductor layer is formed with a recess, preferably a hole, having a side wall extending in a direction substantially perpendicular to the main surface of the substrate and reaching the substrate at its bottom. An impurity material of the first conductivity type is diffused into the semiconductor layer through the side wall of the recess so as to define a p-n unction in the vicinity of and extending substantially in parallel with the side wall of the recess to thereby define a light-emitting activation region extending generally in parallel with the side wall of the recess and thus substantially normal to the main surface of the substrate.

The cap layer is formed only on the semiconductor layer of the second conductivity type, and a second electrode of a second conductivity type side is formed on the cap layer. On the other hand, a first electrode of a first conductivity type side is formed on the rear surface of the substrate which is opposite to the main surface thereof. With this structure, when current is passed between the first and second electrodes, carriers are introduced into the activation region where electrons and holes are recombined to thereby emit light which is then taken out of the substrate in a direction substantially perpendicular to the main surface thereof. It is to be noted that both of the substrate and the semiconductor layer may be comprised of the same semiconductor material with different impurity materials to provide the opposite conductivity types or they may also be comprised of different semiconductor materials. If desired, the substrate may also be comprised of a non-semiconductor material.

Figure 1:
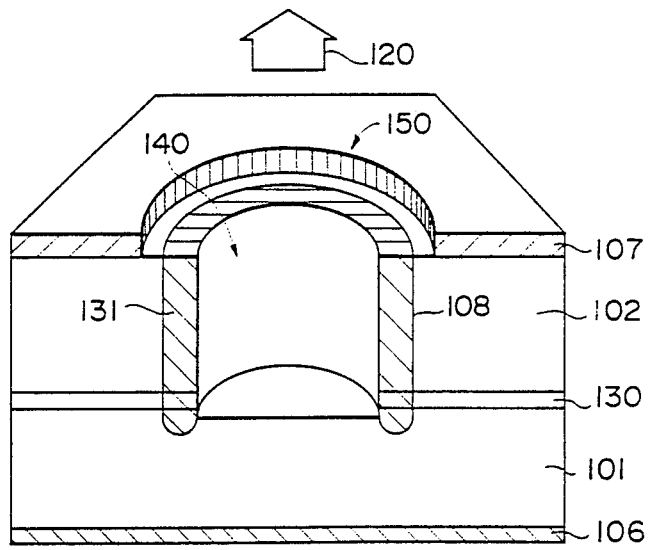
FIGS. 1 through 8 are schematic illustrations showing in cross section a number of embodiments of a semiconductor light-emitting device constructed in accordance with one aspect of the present invention.

Referring now to FIG. 1, there is schematically shown a surface emission type light-emitting device constructed in accordance with one embodiment of the present invention. As shown, the illustrated device includes a p-type GaAs substrate 101 having a main surface, a highly electrically resistant i-type GaAs layer 130 formed on the main surface of the substrate 101 and an n-type GaAs epitaxial layer 102 formed on the i-type GaAs layer 130. The n-type GaAs epitaxial layer 102 is formed with a recess 140 which extends through the i-type GaAs layer 130 and into the substrate 101. In the illustrated embodiment, the recess 140 is in the shape of a hole having a circular cross section and thus the hole 140 has a side wall which extends vertically and substantially perpendicular to the main surface of the substrate 101. It should be noted that the recess 140 may take any other desired shape; however, whatever shape it may take, it must have a side wall which extends in a vertical direction or in a direction substantially perpendicular to the main surface of the substrate 101 at least partly and preferably totally.

An impurity material, such as Zn, is preferably diffused into the structure, in particular semiconductor layer 102, through the side wall of the hole 140 to define a p-type diffusion region 131 which extends substantially in parallel with the side wall of the recess 140 with its bottom extending into the substrate 101. With the formation of the p-type diffusion region 131, a p-n junction is formed in parallel with the side wall of the recess 140 and thus perpendicularly to the main surface of the substrate 101. As shown in FIG. 1, on the n-type GaAs epitaxial layer 102 is formed an n-type side or top electrode 107 in positional alignment with the recess 140. On the other hand, on the rear surface of the substrate 101, which is opposite to the main surface, is formed a p-type side or bottom electrode 106.

With the above-described structure, when current is passed between the two electrodes 106 and 107, current is injected into the p-n junction where or in the vicinity thereof electrons and holes are recombined to thereby emit light. Thus, the vertically extending p-n junction effectively define a vertically elongated light-emitting activation region where recombination between carriers, i.e., electrons and holes, takes place to emit light. The light thus emitted is led out to the exterior as a light output in a direction substantially perpendicular to the main surface of the substrate 101 through a top opening 150 formed in the top electrode 107.

Figure 2:
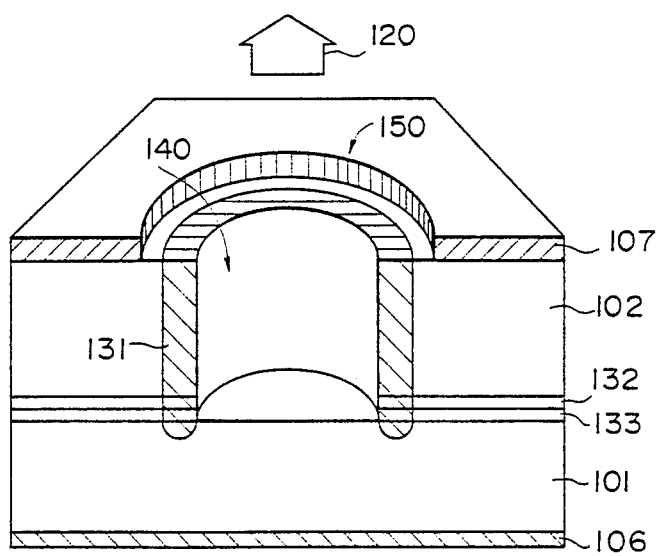

FIG. 2 shows another embodiment of this aspect of the present invention, which may be constructed as a modification of the structure shown in FIG. 1. That is, the structure shown in FIG. 2 may be obtained by replacing the i-type GaAs layer 130 as a highly electrically resistive layer serving as a current blocking layer with a pair of p-type GaAs layer 132 and an n-type GaAs layer 133, which also functions as a current blocking layer. In the present embodiment, since the current blocking layer is formed by two layers of opposite conductivity types, when a voltage is applied in a forward direction, the junction between the two layers 132 and 133 becomes reverse-biased so that these two layers 132 and 133 together serve as an effective current blocking layer.

Figure 3:
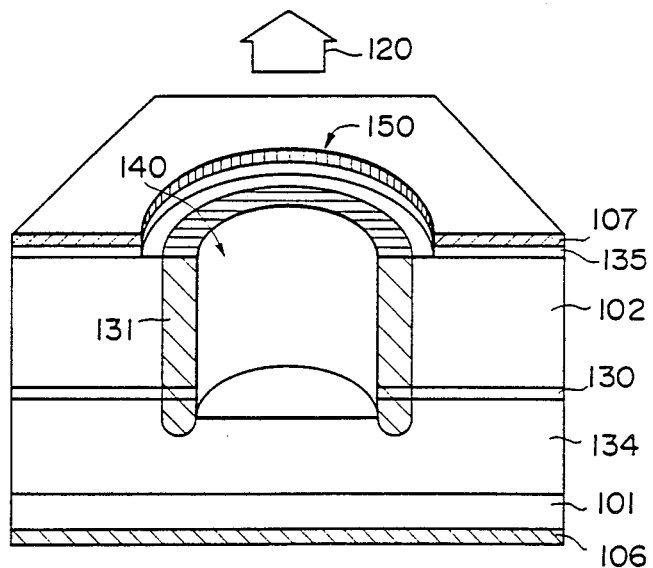

FIG. 3 illustrates a surface emission type semiconductor light-emitting device constructed in accordance with a further embodiment of this aspect of the present invention. As shown, the illustrated device includes a p-type GaAs substrate 101 having a main surface at top, a p-type AlGaAs epitaxial layer 134 formed on the main surface of the substrate 101, an i-type GaAs layer 130 formed on the layer 134 and having a highly electrically resistive layer to thereby serve as a current blocking layer, an n-type GaAs epitaxial layer 102 formed on the layer 130, and an n-type GaAs cap layer 135 formed on the layer 102. A recess, preferably a hole, 140 is formed in the structure extending through the layers 135, 102 and 130 with its bottom located inside of the layer 134. Of importance, the recess or hole 140 has a side wall which extends substantially perpendicularly to the main surface of the substrate 101.

An impurity material, preferably Zn, is diffused into the structure through the side wall of the recess 140 to thereby define a p-type diffusion region 131 which thus extends along the side wall of the recess 140 with its bottom extending into the p-type AlGaAs epitaxial layer 134. With the provision of the p-type diffusion layer 131 by converting the conductivity type of a portion of the structure due to introduction of the impurity material, there is defined a p-n junction inside of the structure as extending substantially vertically or in a direction substantially perpendicular to the main surface of the substrate 101. On the n-type cap layer 135 is formed an n-type side or top electrode 107 aligned in position with the recess 140 similarly with the structure shown in FIG. 1; whereas, a p-type side or bottom electrode 106 is formed on the rear or bottom surface of the substrate 101. With this structure, when current is passed by applying a voltage between the top and bottom electrodes 106 and 107, light is emitted in a direction substantially perpendicular to the main surface of the substrate 101 through an outlet opening 150 defined in the top electrode 107 as indicated by the arrow 120.

In the structure shown in FIG. 3, the carrier densities of the p-type GaAs substrate 101 and the p-type AlGaAs epitaxial layer 134 may be controlled without dependence on the carrier density in the light-emitting active region. In addition, since the p-type AlGaAs epitaxial layer 134 having a wider energy gap than that of the p-type GaAs substrate 101 is formed on the substrate 101, the injected carriers may be effectively caused to flow into the light-emitting active region, so that there may be obtained an enhanced current injection efficiency into the active region. It is to be noted that in the present embodiment use may be made of a p-type GaAs epitaxial layer for the p-type AlGaAs epitaxial layer 134 on the substrate 101, if desired.

Figure 4:
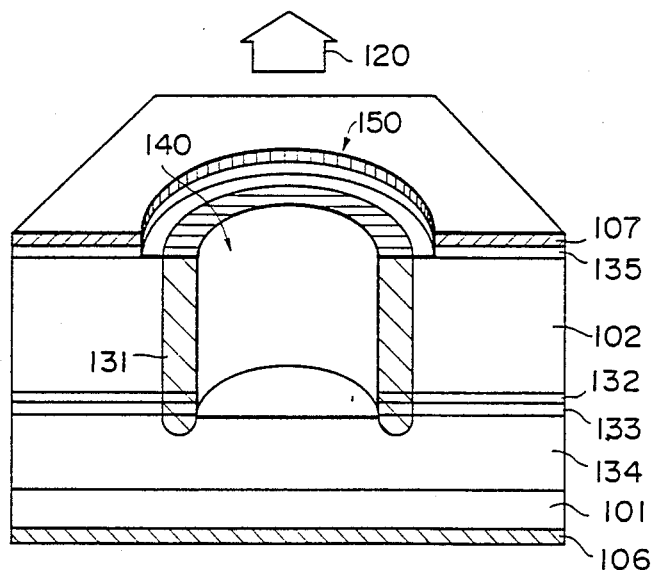

FIG. 4 shows a still further embodiment of this aspect of the present invention, which is similar in many respects to the structure shown in FIG. 3 and which may be obtained as a modification of the structure shown in FIG. 3 by substituting the highly resistive i-type GaAs layer 130 with a pair of overlying p-type GaAs layer 132 and n-type GaAs layer 133 as a current blocking layer. In this embodiment, since the current blocking layer has a two layer structure with a p-n junction defined therebetween, so that a reverse-biased condition is established between the layers, 132 and 133 when a voltage is applied in the structure in the forward direction. Thus, the layers 132 and 133 together effectively serve as a current blocking structure.

Figure 5:
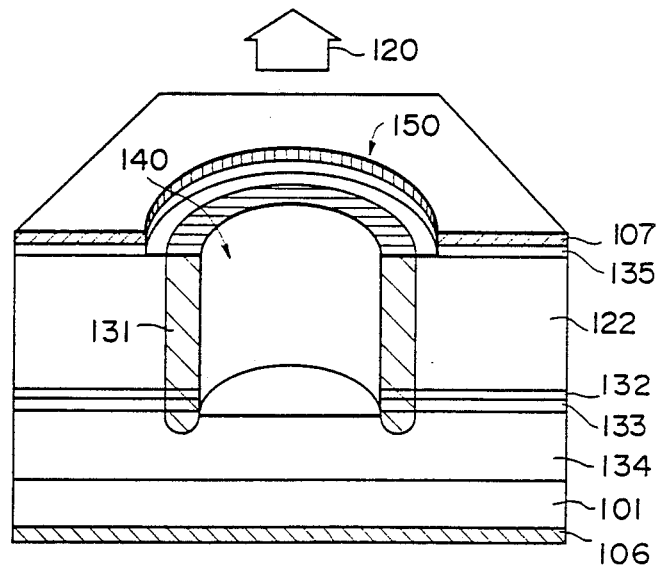
Figure 6:
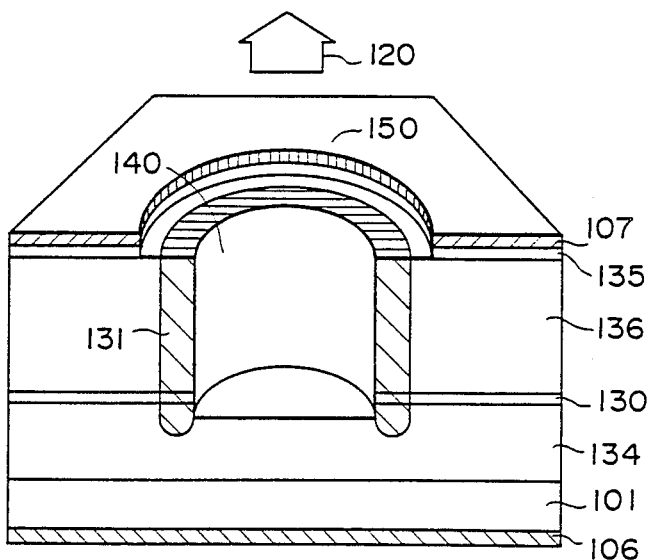

FIG. 5 illustrates a still further embodiment of this aspect of the present invention and the structure shown in FIG. 5 may be obtained by replacing the n-type GaAs epitaxial layer 102 of the structure shown in FIG. 4 with an n-type AlGaAs epitaxial layer 122. In this embodiment, since AlGaAs has a broader energy gap than that of GaAs, there can be obtained emitted light having a shorter wavelength. FIG. 6 shows a still further embodiment of this aspect of the present invention, in which use is made of a highly electrically resistive i-type GaAs layer 130 in place of the pair of p-type GaAs layer 132 and n-type GaAs layer 133 as a current blocking layer. Similarly with the embodiment shown in FIG. 5, also in the present embodiment, since AlGaAs has a broader energy gap than that of GaAs, there may be obtained emitted light having a shorter wavelength.

Figure 7:
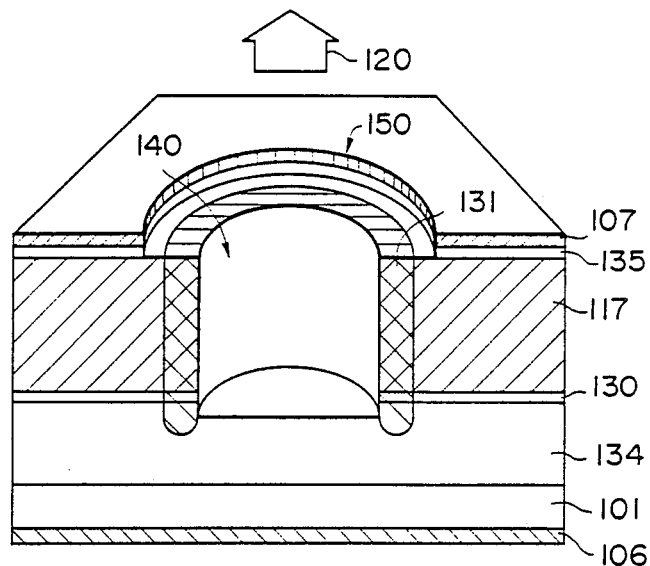
Figure 9:
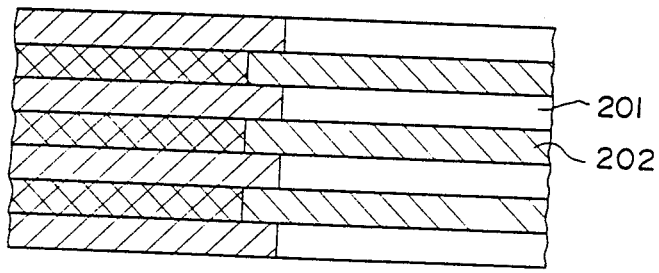
FIG. 9 is a schematic illustration showing one example of a multi-layer structure which may be advantageously applied to the structures shown in FIGS. 7 and 8.

FIG. 7 illustrates a surface emission type semiconductor light-emitting device constructed in accordance with a still further embodiment of this aspect of the present invention. The structure shown in FIG. 7 may be obtained by replacing the n-type GaAs epitaxial layer 102 provided in the structure shown in FIG. 3 with a multi-layer structure 117 including a GaAs layer and an AlGaAs layer. As shown in FIG. 9, the multi-layer structure 117 may have a structure in which a GaAs layer 201 and an AlGaAs layer 202 are formed one on top of another alternately with each layer having a thickness substantially equal to a quarter of the wavelength of emitted light within the layer or a thickness smaller than approximately 30 nm. In the former case in which each layer in the multi-layer structure 117 has a thickness substantially equal to ¼ of the wavelength of emitted light within the layer, the rate of reflectivity for the light, which has been emitted and advances in a direction substantially perpendicular to the substrate 101, may be varied. Thus, this structure allows to provide an optical resonator, so that the light output may be taken out as laser light. On the other hand, in the latter case in which each layer has a thickness less than approximately 30 nm, the multi-layer structure 117 defines a quantum well structure so that carriers may be effectively confined by the quantum effect, thereby allowing to obtain an enhanced current injection efficiency and an enhanced light-emitting efficiency.

Figure 8:
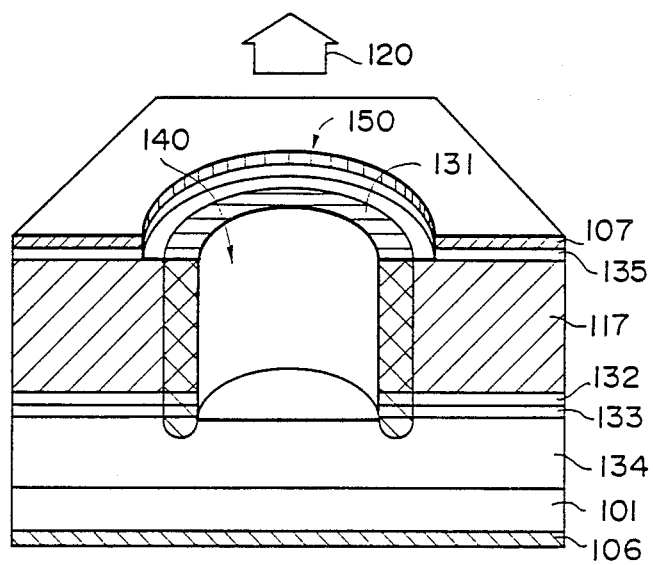

FIG. 8 illustrates a further embodiment of this aspect of the present invention and the structure shown in FIG. 8 may be obtained by replacing the i-type GaAs layer 130 with a pair of p-type GaAs layer 132 and n-type GaAs layer 133 to define a current blocking layer. Also in the present embodiment, since the multi-layer structure 117 is provided, the similar effects as those of the structure shown in FIG. 7 may also be attained. In addition, in the present embodiment, since the pair of p-type GaAs layer 132 and n-type GaAs layer 133 is provided as a current blocking layer, when a voltage is applied across the structure of the present embodiment in the forward direction, a reverse-biased condition is established between the layers 132 and 133 to thereby serve as an effective current blocking structure. It should also be noted that use may be made of a p-type GaAs epitaxial layer in place of the p-type AlGaAs epitaxial layer 134 on the substrate 101.

Figure 10:
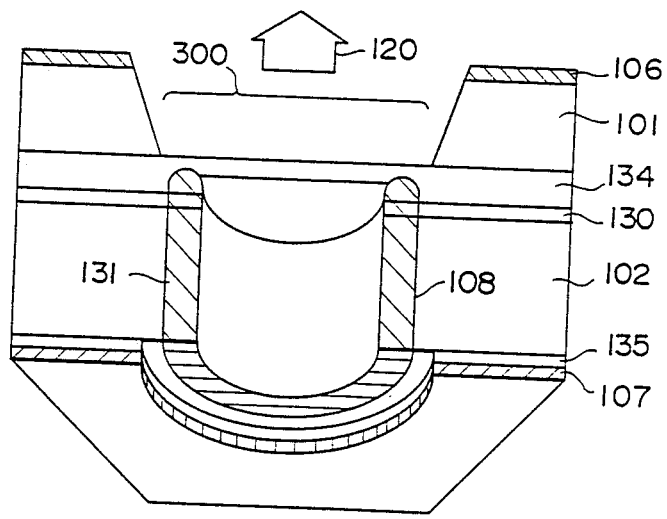
FIGS. 10 through 16 are schematic illustrations showing in cross section a number of embodiments of a semiconductor light-emitting device constructed in accordance with another aspect of the present invention.

FIG. 10 shows a surface emission type semiconductor light-emitting device constructed in accordance with one embodiment of another aspect of the present invention. The present embodiment is structurally similar to the embodiment shown in FIG. 3 and the structure of the present embodiment may be obtained by providing an opening 300 in the p-type GaAs substrate 101 of the structure shown in FIG. 3. As shown in FIG. 10, the opening 300 is formed in the substrate 101 flaring out toward its rear surface and aligned in position with the recess or hole formed in the layer 102. With the structure of the present embodiment, the light emitted from the active region including the p-n junction 108 is prevented from being absorbed by the substrate 101 and may be efficiently taken out of the device as a light output 120.

Figure 11:
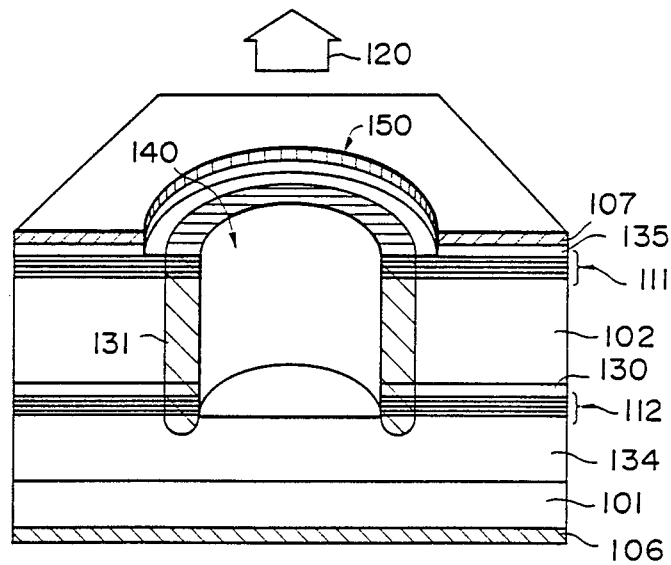

FIG. 11 illustrates a semiconductor light-emitting device constructed in accordance with another embodiment of this aspect of the present invention. As shown, the present embodiment includes a p-type GaAs substrate 101 having a main surface, a p-type AlGaAs epitaxial layer 134 formed on the main surface of the substrate 101, a lower reflecting layer 112 formed on the layer 134, a highly electrically resistive i-type AlGaAs layer 130 formed on the layer 112, an n-type GaAs epitaxial layer 102 on the layer 130, an upper reflecting layer 111 formed on the layer 102, and an n-type GaAs cap layer 135 formed on the layer 111. A recess, preferably a hole, 140 is formed to extend through the layers 135, 111, 102, 130 and 112 and partly into the layer 134, and the side wall of the recess 140 is thus substantially vertical to the main surface of the substrate 101. An impurity material, preferably Zn, is diffused into the structure through the side wall of the recess 140 to thereby define a p-type diffusion region 131 generally in the form of a cylinder. The p-type diffusion region 131 is substantially in parallel with the side wall of the recess 140 with its bottom extending into the p-type AlGaAs epitaxial layer 134. With the provision of the p-type diffusion layer 131, a p-n junction is defined to extend in a direction substantially vertical to the main surface of the substrate 101, so that a light-emitting active region is defined at and/or in the vicinity of the p-n junction in an elongated form in the vertical direction. On the n-type GaAs cap layer 135 is formed an n-type side or top electrode 107 in positional registration with the recess 140 in a manner similar to the embodiment shown in FIG. 1, and a p-type side or bottom electrode 106 is formed on the rear or bottom surface of the substrate 101.

In the present embodiment, each of the upper and lower reflecting structures 111 and 112 has a multi-layer structure including an alternate arrangement of both of GaAs and AlGaAs layers with each layer having a thickness substantially equal to a quarter of the wavelength of emitted light within GaAs and AlGaAs, respectively. In accordance with the present embodiment, since a pair of upper and lower light reflecting structures 111 and 112, respectively, is provided, there is defined an optical resonator. As a result, there may be provided a laser action to obtain a light output as a laser light output. That is, the light emitted propagates vertically upward and downward, whereby the light is reflected by the pair of reflecting structures 111 and 112 back and forth to thereby obtain a gain. If the upper reflecting structure 111 is constructed to have a lower light reflecting efficiency than that of the lower reflecting structure 112, there may be obtained a laser output propagating in a direction substantially perpendicular to the main surface of the substrate 101.

Incidentally, in the present embodiment, use is made of an alternate arrangement of a GaAs layer and an AlGaAs layer for each of the upper and lower reflecting structures 111 and 112; however, use may also be made of a pair of AlGaAs layers having differing energy bandgaps. In addition, in the present embodiment, a current blocking layer is defined by the i-type AlGaAs layer 130; however, as an alternative structure, such a current blocking layer may also be formed by a pair of p-type AlGaAs layer 132 and an n-type AlGaAs layer 133. Besides, the p-type AlGaAs epitaxial layer 134 formed on the substrate 101 may be substituted by a p-type GaAs epitaxial layer.

Figure 12:
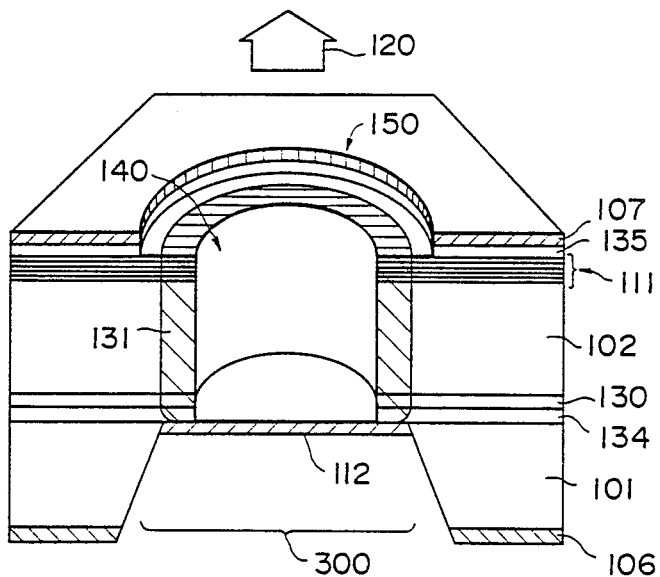

FIG. 12 shows a further embodiment of this aspect of the present invention and the structure shown in FIG. 12 may be obtained by forming an opening 300 in the p-type GaAs substrate 101 of the structure shown in FIG. 11. The opening 300 is opened at the rear or bottom surface of the substrate 101 aligned in position with the recess 140 with the top of the opening 300 reaching the p-type AlGaAs epitaxial layer 134. Besides, in the present embodiment, a lower light reflecting layer 112 is formed at the top of the opening 300 from a metal, a dielectric multi-layer structure, or the like, and, thus, together with the upper reflecting structure 111, it defines an optical resonator structure. In order to define the lower reflecting layer 112 as a dielectric multi-layer structure, use may be made of any desired film, such as an aluminum oxide film, an amorphous silicon film, a silicon oxide film, a silicon nitride film, a zinc oxide film and a titanium oxide film.

Figure 13:
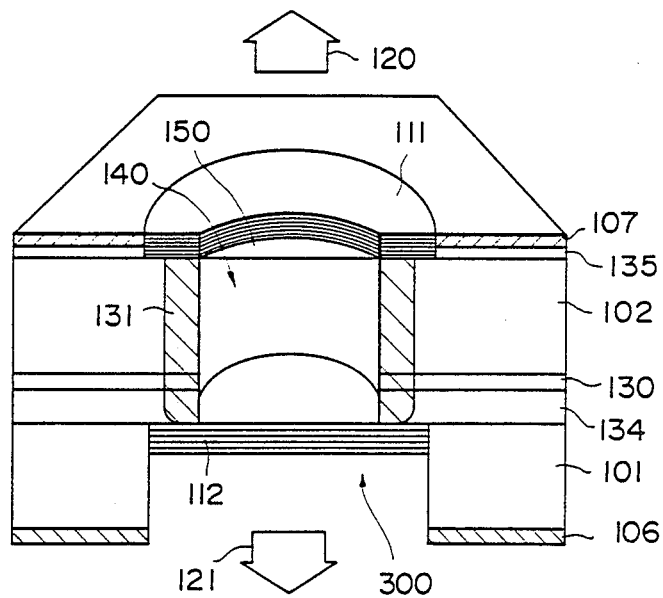

FIG. 13 illustrates a surface emission type semiconductor light-emitting device constructed in accordance with a still further embodiment of this aspect of the present invention. In the present embodiment, use is made of a dielectric multi-layer reflecting structure for the upper reflecting structure 111, and the upper reflecting structure 111 is not disposed between the n-type GaAs epitaxial layer 102 and the n-type GaAs cap layer 135 as in the structure of FIG. 12, but instead it is formed within and in alignment with an opening 150 which defines an outlet for leading emitted light toward the exterior as a light output 120. And, this upper light reflecting structure 111 and the lower light reflecting structure 112 together define an optical resonator. It is to be noted that the upper light reflecting structure 111 may be defined in the form of a dielectric multi-layer structure by using a combination of any of an aluminum oxide film, an amorphous silicon film, a silicon oxide film, a silicon nitride film, a zinc oxide film and a titanium oxide film. In the present embodiment, if the light reflecting efficiency of the upper reflecting structure 111 is set to be lower than that of the lower reflecting structure 112, emitted light may be taken out as a light output 120 through the opening 150; on the other hand, if the upper reflecting structure 111 is designed to have a higher reflecting efficiency than that of the lower reflecting structure 112, emitted light may be taken out as a light output 121 through the opening 300. Accordingly, by appropriately adjusting the values of light reflecting efficiency between the upper and lower reflecting structures 111 and 112 relative to each other, emitted light may be taken out to the exterior through the openings 150 and 300 at any desired ratio.

Figure 14:
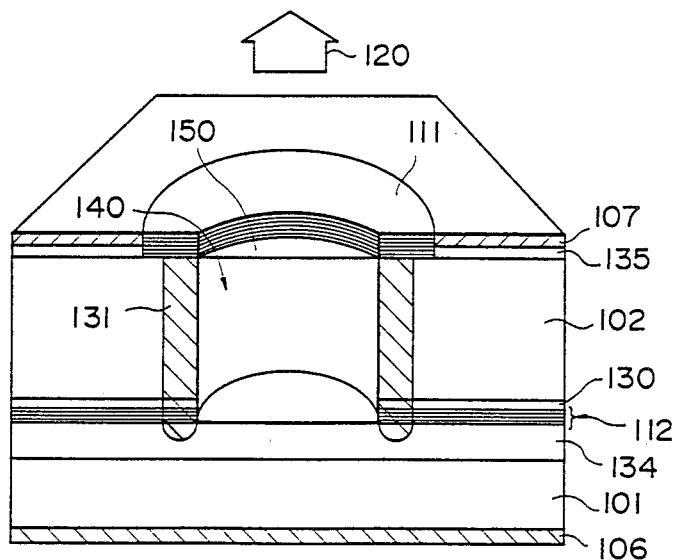

FIG. 14 illustrates a surface emission type light-emitting device constructed in accordance with a still further embodiment of this aspect of the present invention. In the present embodiment, use is made of a dielectric multi-layer light reflecting structure for the upper reflecting structure 111 in the device shown in FIG. 11, and the upper reflecting structure 111 is not disposed between the n-type GaAs epitaxial layer 102 and the n-type GaAs cap layer 135, but instead it is positioned in alignment with the opening 150 which defines an outlet for light output 120 in a manner similar to that of FIG. 13. Thus, both of these upper and lower reflecting structures 111 and 112 define an optical resonator.

Figure 15:
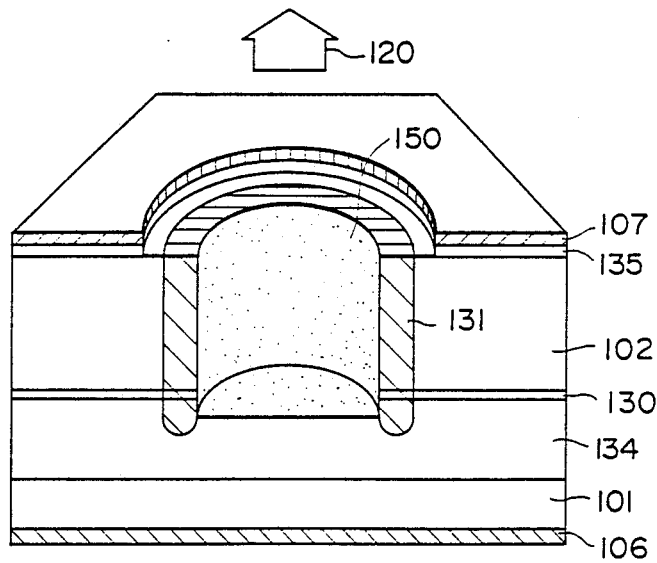

FIG. 15 illustrates a surface emission type light-emitting device constructed in accordance with a still further embodiment of this aspect of the present invention. The present embodiment is similar in structure to the device shown in FIG. 3 and it may be obtained by filling the recess 140 with a material which does not absorb the light emitted from the active region. With this structure, since the recess 140 is filled, there is obtained an enhanced mechanical integrity. In addition, if the filling material is so selected to have a high thermal conductivity, there can also be obtained an enhanced heat dissipating characteristic. The filling material may be either electrically conductive or non-conductive depending on applications. It should be noted that the feature of the present embodiment is equally applicable to any of the previous embodiments shown in FIGS. 1 through 14.

Figure 16:
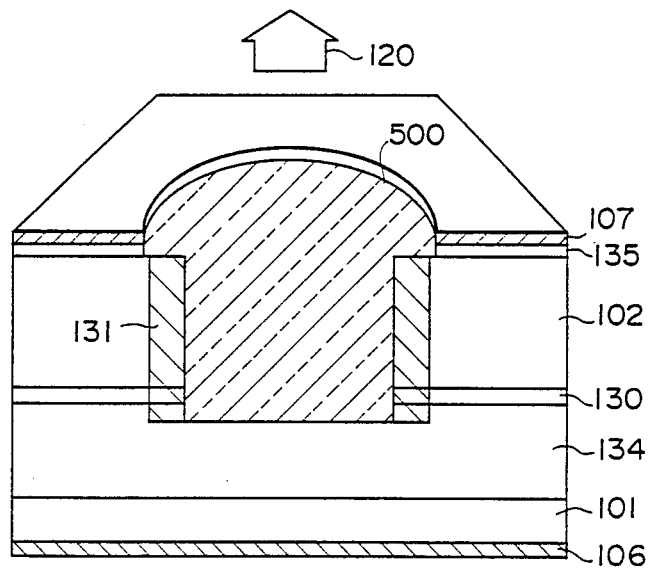

FIG. 16 illustrates a surface emission type light-emitting device constructed in accordance with a still further embodiment of this aspect of the present invention. The present embodiment is provided with a lens 500 at the opening 150 through which emitted light is taken out as a light output. In the illustrated embodiment, the recess 140 is filled with a material a part of which is used to define the lens 500 at its top. Thus, the filling material is preferably selected to have a high heat dissipating characteristic. With the provision of the lens 500 at the top, light is made convergent when passing therethrough, and thus it is preferably located in alignment with the top opening 150 of the active region. The lens 500 may be formed by a material selected from a group consisting essentially of glass, quartz, plastics and high polymers, electrically conductive or non-conductive. In the present embodiment, since the lens 500 is located at the opening 150, emitted light may be directed in a desired direction with high intensity, so that an enhanced optical coupling efficiency may be obtained when connected to an optical fiber or the like. It is to be noted that the feature of the present embodiment may also be advantageously applied to any of the previous embodiments shown in FIGS. 1 through 15.

Figure 17:
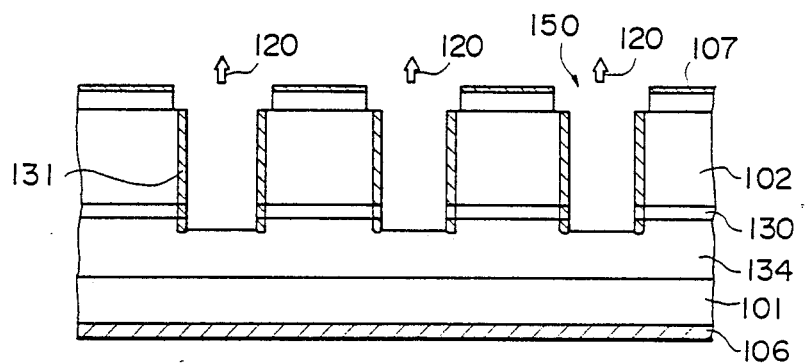
FIGS. 17 through 21 are schematic illustrations showing various examples of a semiconductor light-emitting device when constructed in the form of a two-dimensional array in accordance with a further aspect of the present invention.
Figure 18:
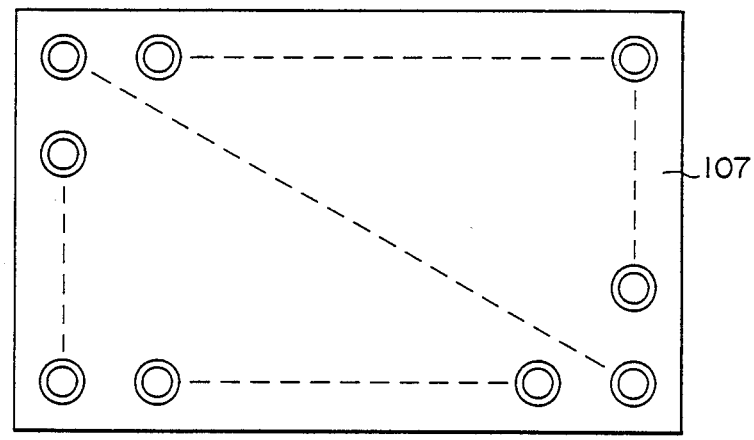

FIGS. 17 and 18 illustrate a surface emission type semiconductor light-emitting device having a plurality of light-emitting elements, each having the structure shown in FIG. 3, arranged in the form of a two-dimensional array having k rows and j columns constructed in accordance with one embodiment of a further aspect of the present invention. In the present embodiment, both of upper and lower electrodes 107 and 106 are defined as common electrodes to all of the light-emitting elements. With the structure of the present embodiment, there is provided a surface emission type light-emitting device having a two-dimensional array of a plurality of light-emitting elements, so that a surface so as to provide a large total light output may be provided. It should be noted that the feature of the present embodiment may be applied to any of the previous embodiments shown in FIGS. 1 through 16 without being limited only to the embodiment shown in FIG. 3.

Figure 19:
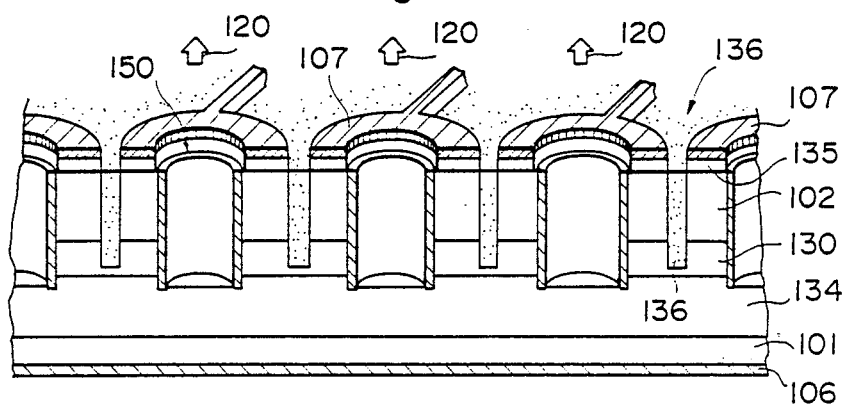
Figure 20:
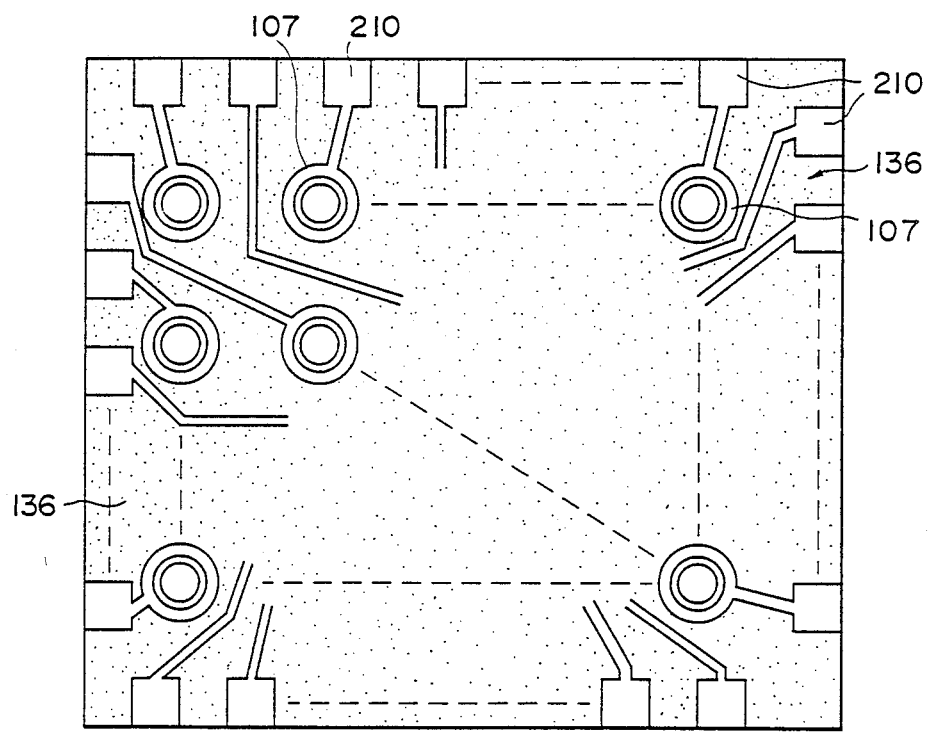

FIGS. 19 and 20 illustrate a surface emission type semiconductor light-emitting device having a plurality of light-emitting elements, each having the structure shown in FIG. 3, arranged in the form of a two-dimensional array having k rows and j columns constructed in accordance with another embodiment of this further aspect of the present invention. In the present embodiment, as shown in FIG. 19, a high electrical resistive layer 136 is formed in the form of a vertical wall extending between two adjacent light-emitting elements so as to provide an electrical isolation between the two light-emitting elements. In the illustrated embodiment, the high electrical resistant layer 136 is formed to extend vertically downward through an n-type GaAs cap layer 135 and an epitaxial semiconductor layer 102 comprised of n-type GaAs or n-type AlGaAs and into a current blocking layer 130 which is comprised of i-type AlGaAs or a pair of n-type AlGaAs and p-type AlGaAs overlying one on top of another. The n-type GaAs cap layer 135 and a top electrode 107 are also subdivided and electrically isolated by the high resistance layer 136. Each of the top electrodes 107 is electrically connected to a predetermined terminal electrode 210. On the other hand, a p-type side or bottom electrode 106 is formed at the bottom of the device as a common electrode.

In the present embodiment, each of a plurality of light-emitting elements defined and arranged in a two-dimensional array having k rows and j columns in a semiconductor structure is electrically isolated by the high electrical resistant layer 136. In addition, the top electrodes 107 are defined as individual electrodes, one for each light-emitting element, and electrically isolated from one another by the high electrical resistant layer 136 with each of the individual top electrodes 107 being electrically connected to a corresponding terminal electrode 210. With this structure, when a voltage is applied between the common electrode 106 and one or more of a plurality of individual top electrodes 107 selectively to thereby cause current to flow therebetween, the plurality of light-emitting elements may be selectively activated to emit light. It is to be noted that the feature of the present embodiment may also be applied to each of the previous embodiments shown in FIGS. 1 through 16 and should not be limited only to the embodiment shown in FIG. 3.

Figure 21:
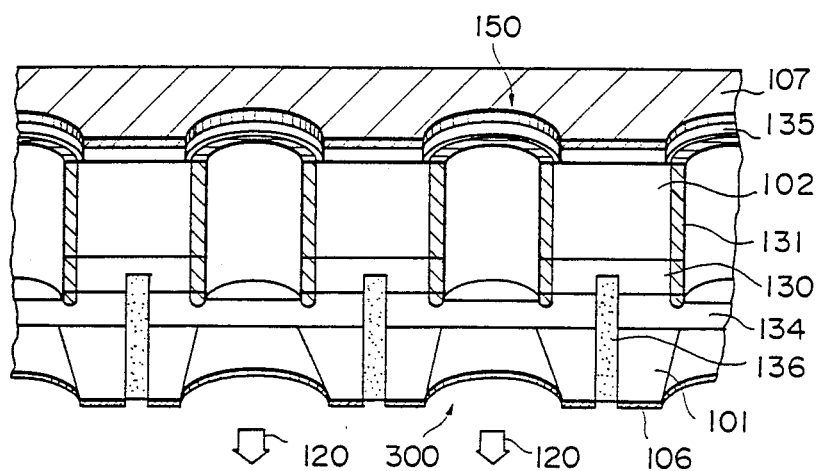

FIG. 21 illustrates a surface emission type semiconductor light-emitting device having a plurality of light-emitting elements, each having the structure shown in FIG. 10, arranged in the form of a two-dimensional array having k rows and j columns constructed in accordance with another embodiment of this further aspect of the present invention. The present embodiment also includes a high electrical resistant or insulating layer 136 in a manner similar to the embodiment shown in FIGS. 19 and 20 to thereby provide an electrical isolation for each of the plurality of light-emitting elements. In the present embodiment, the high electrical resistant layer 136 is formed to extend through a p-type GaAs substrate 101 vertically upward and also through an epitaxial semiconductor layer 134. The high electrical resistant layer 136 extends into a current blocking layer 130 and terminates therein. Bottom electrodes 106 are defined as individual electrodes which are isolated from one another by the high electrical resistant layer 136 in a manner similar to the individual electrodes 107 in FIG. 20. Thus, each of the individual electrodes 106 in the structure of FIG. 21 is electrically connected to a terminal electrode (not shown) which is typically provided along an edge of the device. On the other hand, in the structure shown in FIG. 21, a top electrode 107 is provided as a common electrode common to all of the light-emitting elements. It should be understood that the present embodiment possesses all of the advantages described with respect to the previous embodiment shown in FIGS. 19 and 20.

It is to be noted that in any of the embodiments described above, the substrate 101 may include any other desired material, such as InP, GsP or GaAsP, other than GaAs described above. In addition, the epitaxial layer 134 formed on the substrate 101 may also be formed from any other desired material, such as AlGaAs, GaAsP, InGaAsP, AlGaInP, GaP, InP or InGaP than GaAs described above.

As a material for forming the current blocking layer 130, use may also be made of AlGaAs, GaAsP, InGaAsP, AlGaInP, GaP, InP and InGaP other than GaAs as in the above-described embodiments. The GaAs layer 102 having a light-emitting activation layer may also be comprised of such a material as GaAsP, AlGaAs, InGaAsP, AlGaInP, GaP, InP or InGaP other than GaAs. Furthermore, a multi-layer structure for defining a light reflecting structure or a quantum well structure may also be comprised of a combination of two kinds of AlGaAs different in energy gap, a combination of InP and InGaP, a combination of InGaAsP and InP, a combination of GaAsP and GaP, a combination of GaAs and GaAsP, a combination of InP and AlGaInP or a combination of InGaP and AlGaInP other than a combination of GaAs and AlGaAs.

In each of the embodiments shown in FIGS. 1 through 21 and described above, a recess or hole is formed in a semiconductor layer with its side wall extending substantially perpendicular to the main surface of a substrate to thereby define a p-n junction which also extends substantially vertical to the main surface of the substrate and is located in the vicinity of the side wall of the recess or hole. With this structure, a light-emitting activation region is defined at and/or in the vicinity of the p-n junction and thus the activation region is also elongated in a direction vertical to the main surface of the substrate. Since light is emitted in the elongated direction of the activation region, there can be obtained an enhanced light emitting efficiency. In addition, since the activation region is located close to the side wall of a recess or hole, the heat produced in the activation region may be dissipated at high efficiency, and thus the activation region may be maintained at constant temperature. In addition, a current blocking layer is formed extending on and in parallel with the main surface of the substrate and the provision of such a current blocking layer contributes to provide an increased current injecting efficiency into the activation region. With this structure, there can be obtained a light output emitted in a vertical direction with respect to the main surface of a substrate and at high intensity as well as at high efficiency. From the manufacturing viewpoint, since it is not necessary to make a hole in a substrate, the present invention is significantly advantageous. Besides, since no hole is required to be formed in a substrate, the device as a whole has an enhanced mechanical integrity and it is also advantageous in manufacturing a high-density array.

In accordance with another aspect of the present invention, there is provided a surface emission type semiconductor light-emitting device comprising a substrate having a main surface, a first semiconductor layer formed on the main surface of the substrate and having a recess and a light-emitting activation region (preferably including a p-n junction) formed in the vicinity of the recess for emitting light in a direction substantially perpendicular to the main surface of the substrate, an electrode means for introducing current into the semiconductor layer, and a current blocking layer formed on the main surface of the substrate and having a multi-layer structure including at least three layers and including a second semiconductor layer which has an energy gap larger than that of the first semiconductor layer.

In the preferred embodiment of this aspect of the present invention, a current blocking layer having a multi-layer structure including at least three layers is formed on the main surface of a semiconductor substrate of a first conductivity type, and the current blocking layer includes a second semiconductor layer having an energy gap larger than that of a first semiconductor layer of a second conductivity type which is formed on the substrate and includes a light-emitting region. And, the first semiconductor layer is formed on the current blocking layer and a cap layer of the second conductivity type is formed on the first semiconductor layer. The first semiconductor layer is formed with a recess, preferably a hole, which has a side wall extending in a direction substantially perpendicular to the main surface of the substrate, and the activation region is defined within the first semiconductor layer along the side wall of the recess or hole which has its bottom extending into the semiconductor substrate. The light-emitting activation region is preferably defined by forming a p-n junction within the first semiconductor layer and the p-n junction is preferably formed by introducing an impurity material of the first conductivity type into the first semiconductor layer of the second conductivity type through the side wall of the recess or hole. Thus, the p-n junction may be defined in the vicinity and along the side wall of the recess or hole. The cap layer is formed only on the first semiconductor layer and an electrode for the second conductivity side is formed on the cap layer. Another electrode for the first conductivity side is formed on the rear surface of the substrate, which is opposite to the main surface.

With the above-described structure, when current is passed between the pair of electrodes, current is injected into the light-emitting activation region where recombination between electrons and holes takes place to thereby emit light in a direction substantially perpendicular to the main surface of the substrate. It should be noted that the substrate and the first semiconductor layer described above may be comprised of the same semiconductor material with different impurity materials to provide opposite conductivity type or of different semiconductor materials. It should also be noted that the cap layer may be discarded, if desired.

Figure 22:
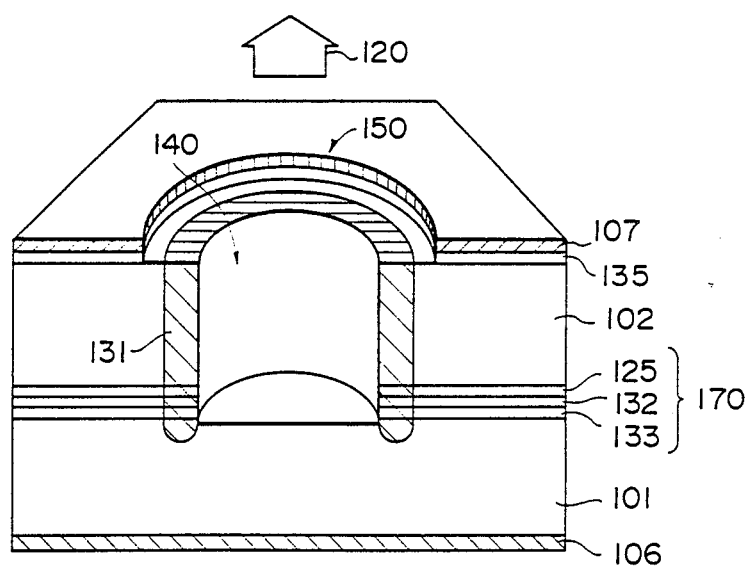
FIGS. 22 through 29 are schematic illustrations showing in cross section a number of embodiments of a semiconductor light-emitting device constructed in accordance with a still further aspect of the present invention.

Referring now to FIG. 22, there is schematically shown a surface emission type semiconductor light-emitting device constructed in accordance with one embodiment of this aspect of the present invention. As shown, the illustrated light-emitting device includes a p-type GaAs substrate 101 having a main surface at its top, an n-type GaAs layer 133 formed on the substrate 101, a p-type AlGaAs layer 132 formed on the layer 133, an n-type AlGaAs layer 125 formed on the layer 132, and an n-type GaAs epitaxial layer 102 formed on the layer 125. The n-type GaAs epitaxial layer 102 is formed with a recess or hole 140 having a side wall which extends in a direction substantially perpendicular to the main surface of the substrate 101 with the bottom of the recess 140 extending into the substrate 101. An impurity material, such as Zn, is diffused into the structure through the side wall of the recess 140 to thereby define a p-type diffusion region 131 which is formed along the side wall of the recess 140 generally cylindrical in shape with its bottom extending into the substrate 101. With the formation of the p-type diffusion region 131, a p-n junction is defined in the structure extending in a direction substantially perpendicular to the main surface of the substrate 101. As shown in FIG. 22, on the n-type GaAs epitaxial layer 102 is formed an n-type side electrode 107 aligned in position with the recess 140; on the other hand, a p-type side electrode 106 is formed on the rear side of the substrate 101 opposite to the main surface.

When current is passed between the electrodes 106 and 107, current is injected into the vertically extending p-n junction where electrons and holes are recombined to emit light. The light thus emitted is taken out of the device in an upward direction through a top opening 150, so that the emitted light may be taken out as a light output 120 propagating in a direction substantially perpendicular to the main surface of the substrate 101.

In the illustrated embodiment, the three layers of n-type AlGaAs layer 125, p-type AlGaAS layer 132 and n-type GaAs layer 133 overlying one on top of another define a current blocking layer 170, and the n-type AlGaAs layer 125 has an energy gap larger than that of the n-type GaAs epitaxial layer 102 having a light-emitting activation region. Thus, the current blocking layer 170 has a three-layer structure. When the entire structure shown in FIG. 22 is forwardly biased with the application of a voltage between the electrodes 106 and 107, a reverse-biased condition is established between the n-type GaAs layer 133 and the p-type AlGaAs layer 132 to thereby define a high resistive region, and, in addition, a diffusion potential between the p-type AlGaAs layer 132 and the n-type AlGaAs layer 125 becomes larger than that of the activation region. Thus, the three-layer structure current blocking layer 170 can prevent leakage current from occurring and thereby allow to increase the current injection efficiency into the activation region.

Figure 23:
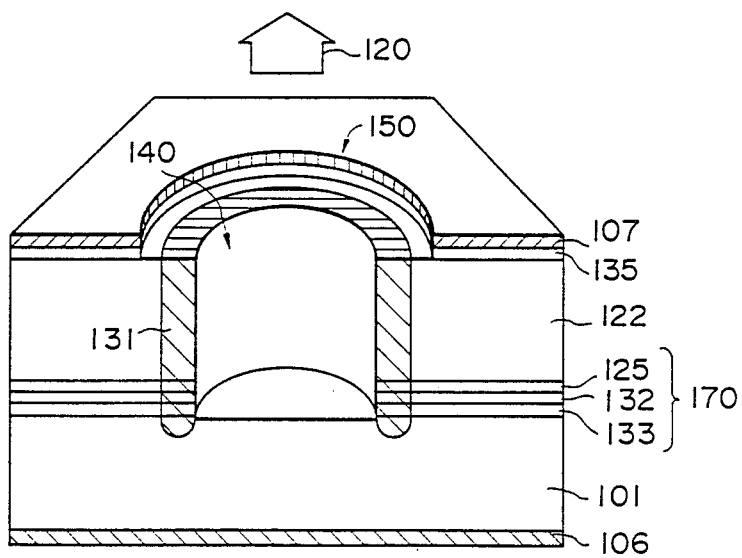

FIG. 23 illustrates another embodiment of this aspect of the present invention, which may be obtained by modifying the structure shown in FIG. 22. That is, the present embodiment may be obtained by replacing the n-type GaAs epitaxial layer 102 of FIG. 22 with an n-type AlGaAs epitaxial layer 122. In addition, the present embodiment includes a current blocking layer 170 which has a three-layer structure including an n-type AlGaAs layer 125, a p-type AlGaAs layer 132, each having a larger Al composition ratio than that of the n-type AlGaAs epitaxial layer 102, and an n-type GaAs layer 133. In the present embodiment, since use is made of the n-type AlGaAs epitaxial layer 122 as a light-emitting semiconductor layer which includes a light-emitting activation region, the activation region has a larger energy gap as compared with the case of the n-type GaAs layer 102, so that light having a shorter wavelength can be emitted. Besides, it is so structured that each of the n-type AlGaAs layer 125 and p-type AlGaAs layer 132 of the current blocking layer 170 has an Al composition ratio larger than that of the n-type AlGaAs epitaxial layer 122, and thus the current blocking layer 170 of the present embodiment should function as in the same manner as that of the embodiment shown in FIG. 22.

Figure 24:
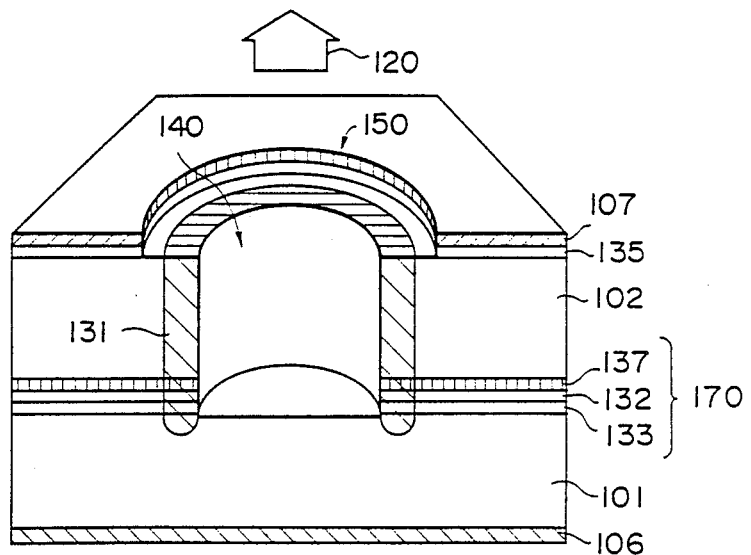

FIG. 24 illustrates a further embodiment of this aspect of the present invention, which may be obtained by modifying the structure shown in FIG. 22. That is, the present embodiment includes a current blocking layer 170 which is comprised of an i-type GaAs layer 137, a p-type GaAs layer 132 and an n-type GaAs layer 133. In the present embodiment, since the current blocking layer 170 includes the i-type GaAs layer 137, the occurrence of leakage current is effectively prevented as in the structure shown in FIG. 22 and thus there is provided an enhanced current injection efficiency into the activation region. It is to be noted that use may also be made of i-type AlGaAs for the i-type GaAs layer 137 and also of p-type AlGaAs for the p-type GaAs layer 132, if desired.

Figure 25:
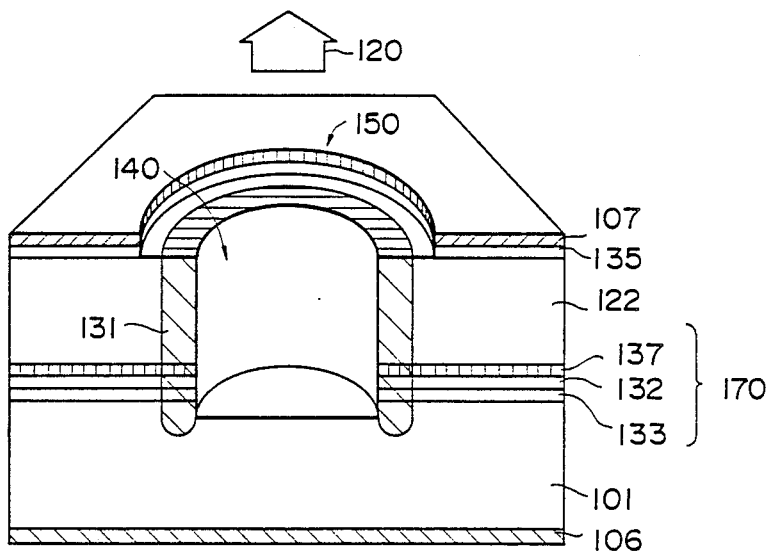

FIG. 25 illustrates a still further embodiment of this aspect of the present invention, which may be obtained by modifying the structure shown in FIG. 24. That is, the structure shown in FIG. 25 may be obtained by substituting the n-type GaAs epitaxial layer 102 of the structure shown in FIG. 24 by an n-type AlGaAs epitaxial layer 122. In the present embodiment, since use is made of the n-type AlGaAs epitaxial layer 122 as a layer including a light-emitting activation region, the light-emitting layer has a larger energy gap as compared with the case using n-type GaAs, so that there can be obtained emitted light having a shorter wavelength. In addition, since the current blocking layer 170 includes the i-type GaAs layer 137, the occurrence of leakage current is effectively prevented when current is passed between the electrodes.

It is to be noted that use may also be made of i-type AlGaAs for the i-type GaAs layer 137 and further use may also be made of p-type AlGaAs for the p-type GaAs layer 132, if desired. In such an alternative structure, it should be so structured that both of the i-type AlGaAs layer 137 and the p-type AlGaAs layer 132 have an Al composition ratio larger than that of the n-type AlGaAs epitaxial layer 122. With this structure, the similar current blocking effects as those of the embodiment shown in FIG. 22 can be obtained. It should also be noted that, for the n-type GaAs layer 133 of the current blocking layer 170, use may also be made of n-type AlGaAs instead of n-type GaAs.

In all of the embodiments shown in FIGS. 22 through 25, the substrate 101 may be comprised of such a material as InP, GaP, GaAsP and AlGaAs other than GaAs described above. In addition, as a material for forming each layer of the current blocking layer 170, use may be made of such a material as GaAsP, InGaAsP, AlGaInP, GaP, InP and InGaP other than GaAs and AlGaAs described above. The GaAs layer 102 having a light-emitting activation region may also be comprised of such a material as GaAsP, InGaAsP, AlGaInP, GaP, InP and InGaP other than AlGaAs described above.

In any of the embodiments shown in FIGS. 22 through 25 and described above, since use is made of a current blocking layer having at least three layers and including a semiconductor layer having an energy gap larger than that of the n-type GaAs epitaxial layer having therein a light-emitting activation region, the occurrence of leakage current is effectively prevented when current is passed between the pair of electrodes and thus an enhanced current injection efficiency into the activation region can be obtained. In addition, since the recess or hole 140 having a side wall extending in a direction substantially perpendicular to the main surface of the substrate 101 is provided and the activation region defined by a p-n junction is located adjacent to and along the side wall, heat may be efficiency dissipated from the activation region and an enhanced light emitting efficiency in the vertical direction can be obtained. In addition, in this aspect of the present invention, there is also no need to form a hole or recess in the substrate 101 itself, the device as a whole has a high structural integrity and it is possible to form a high-density array.

In accordance with another aspect of the present invention, there is provided a surface emission type semiconductor light-emitting device which comprises a substrate having a main surface, a light-emitting semiconductor layer formed on the main surface of the substrate and including a light-emitting activation region, preferably defined by a p-n junction, capable of emitting light in a direction substantially perpendicular to the main surface, a pair of electrodes for introducing current into the semiconductor layer, a current blocking layer formed in the semiconductor layer extending in parallel with and in contact with the main surface, a current narrowing region formed inside of the semiconductor layer adjacent to one of the pair of electrodes so as to narrow a current path for the current flowing between the pair of electrodes, and a recess formed in the semiconductor layer and having a side wall extending substantially perpendicularly to the main surface.

In the preferred embodiment, there is prepared a semiconductor substrate of a first conductivity type having a main surface and a first semiconductor layer of the first conductivity type is formed on the main surface of the substrate. Then, a current blocking layer having a single layer structure or a multi-layer structure is formed on the first semiconductor layer of the first conductivity. A second semiconductor layer of a second conductivity type is then formed on the current blocking layer, and a cap layer of the second conductivity layer for facilitating the formation of an electrode is formed on the second semiconductor layer. And, the second semiconductor layer is formed with a recess or hole having a side wall extending in a direction substantially perpendicular to the main surface of the substrate and the bottom of the recess extends into the first semiconductor layer. Preferably, an impurity material of the first conductivity type is diffused into the structure through the side wall of the recess to define a diffusion region of the first conductivity type so that a p-n junction is defined in the vicinity and along the side wall of the recess. The p-n junction serves to define a light-emitting activation region therearound.

The cap layer is formed only on the second semiconductor layer and not in the recess and on the diffusion region. In addition, in accordance with the principle of this aspect of the present invention, a current narrowing region of the first conductivity type for narrowing a current path to thereby prevent the occurrence of leakage current is formed in the cap layer and also in the second semiconductor layer. Such a current narrowing region is formed to extend through the cap layer and partly into the second semiconductor layer, but the current narrowing region does not extend into or closer to the light-emitting activation region. In addition, the current narrowing region terminates within the second semiconductor layer and does not extend all the way to the current blocking layer. A second conductivity type side electrode is formed on the cap layer and a first conductivity type side electrode is formed on the back surface of the substrate opposite to its main surface.

With the above-described structure, when current is passed between the pair of electrodes, current is injected into the activation region where recombination between electrons and holes takes place to generate light which is then emitted in a direction substantially perpendicular to the main surface of the substrate at high intensity. When the present device is forwardly biased to inject current into the activation region to cause emission of light, the current narrowing region becomes reverse-biased so that a depletion region, i.e., a high electrical resistant region, extends into the second semiconductor layer, which contributes to narrow a current path within the second semiconductor layer so as to prevent the occurrence of leakage current which does not participate in emission of light and thus to cause the current to be injected into the activation region as much as possible. Thus, with the provision of such a current narrowing region, current can be efficiently injected into the light-emitting activation region, which thus allows to provide an enhanced efficiency and intensity. It is to be noted that the substrate and each of the semiconductor layers may be comprised of the same semiconductor material with different or appropriate impurity materials or they may be comprised of different semiconductor materials.

Figure 26:
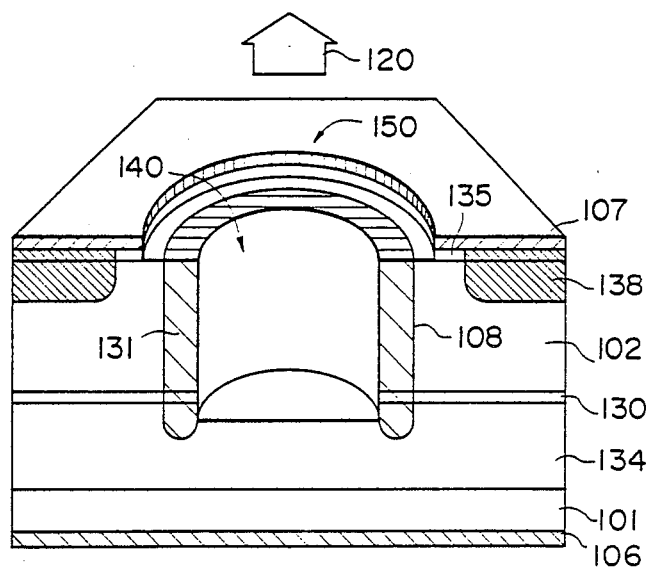

Referring now to FIG. 26, there is schematically shown a surface emission type semiconductor light-emitting device constructed in accordance with one embodiment of this aspect of the present invention. As shown, the illustrated device includes a p-type GaAs substrate 101 having a flat main surface, a p-type GaAs epitaxial layer 134 formed on the main surface of the substrate 101, a current blocking layer 130 high in electrical resistance and comprised of i-type GaAs formed on the layer 134 and a n-type GaAs epitaxial layer 102 formed on the layer 130. The n-type GaAs epitaxial layer 102 is formed with a recess or hole 140 generally cylindrical in shape and having a side wall extending in a direction substantially perpendicular to the main surface of the substrate 101. The bottom of the recess 140 extends into the p-type GaAs epitaxial layer 134. A selected impurity, e.g., Zn, is introduced into the structure through the side wall of the recess 140 so that a p-type diffusion region 131 is defined adjacent to and along the side wall of the recess 140 with its bottom extending into the p-type GaAs epitaxial layer 134. With the provision of the p-type diffusion region 131, there is defined a p-n junction extending substantially vertical to the main surface of the substrate 101. On the n-type GaAs epitaxial layer 102 is formed an n-type GaAs cap layer 135 having an opening 150 which is aligned with the recess 140.

A current narrowing region 138 of p-type GaAs is formed extending through the cap layer 135 and into the underlying n-type GaAs epitaxial layer 102 by introducing a p-type impurity material, for example, by diffusion or ion implantation. The current narrowing region 138 is so formed to be separated away from an activation region or p-n junction 108 over a predetermined distance and it terminates within the semiconductor layer 102 and does not extend into the current blocking layer 130. The positioning of the current narrowing region 138 is determined such that a depletion region formed along the boundary of the current narrowing region 138 occupies most of the remaining portion of the semiconductor layer 102 to thereby cause most of the current to flow into the activation region. An n-type side electrode 107 is formed on the n-type GaAs cap layer 135 and a p-type side electrode 106 is formed on the rear surface of the substrate 101 opposite to its main surface.

When current is passed between the pair of electrodes 106 and 107, the current is injected into the activation region generally defined by the vertically extending p-n junction, where holes and carriers are recombined to emit light. Thus emitted light is then led out to the exterior through the opening 150 and thus there is obtained a light output 120 advancing in a direction substantially perpendicular to the main surface of the substrate 101.

Figure 27:
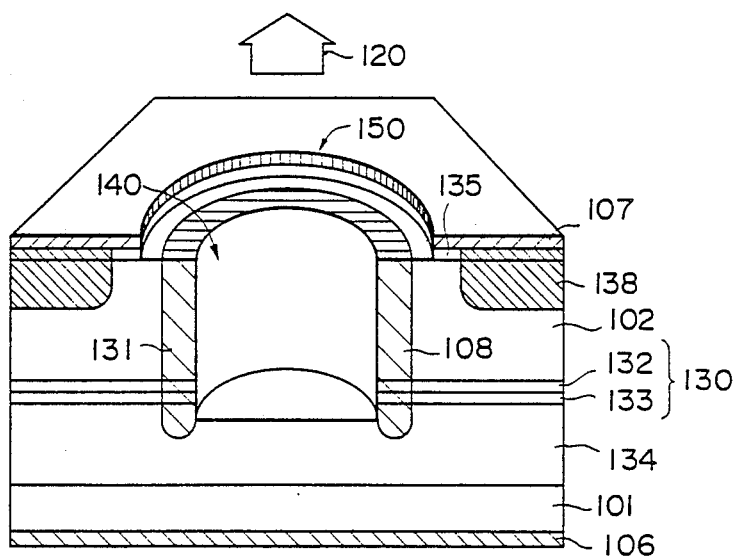

FIG. 27 illustrates another embodiment of this aspect of the present invention, which may be obtained by modifying the structure shown in FIG. 26. That is, the structure shown in FIG. 27 may be obtained by replacing the i-type GaAs current blocking layer 130 of FIG. 26 by a current blocking layer including a pair of p-type GaAs layer 132 and an n-type GaAs layer 133. In this embodiment, when the entire device is forwardly biased, a reverse-biased condition is established in the current blocking layer 130 and thus current may be effectively blocked.

In any of the embodiments shown in FIGS. 26 and 27 and described above, the substrate 101 may be comprised of such a material as InP, GaP or GaAsP other than GaAs described above. And, each of the layers forming the current blocking layer 130 may also be comprised of such a material as GaAsP, AlGaAs, InGaAsP, AlGaInP, GaP, InP or InGaP other than GaAs described above. In addition, the light-emitting GaAs layer 102 having a light-emitting activation region may be comprised of such a material as GaAsP, AlGaAs, InGaAsP, AlGaInP, GaP, InP or InGaP other than GaAs described above.

In accordance with a still further aspect of the present invention, there is provided a surface emission type semiconductor light-emitting device which comprises a substrate having a main surface, a light-emitting semiconductor layer including a light-emitting activation region, preferably defined by a p-n junction, capable of emitting light in a direction substantially perpendicular to the main surface, a pair of electrodes for introducing current into the light-emitting semiconductor layer, a first current blocking layer formed below the light-emitting semiconductor layer, a recess formed in the light-emitting semiconductor layer and having a side wall extending in a direction substantially perpendicular to the main surface and adjacent to and along the activation region and a second current blocking layer formed above the first current blocking layer and blow one of the pair of electrodes.

In the preferred embodiment of this aspect of the present invention, the device includes a semiconductor substrate of a first conductivity type having a main surface on which a first semiconductor layer of the first conductivity type is formed. And, a first current blocking layer comprised of a single layer or a plurality of layers is formed on the first semiconductor layer, and a second semiconductor layer of a second conductivity type is formed on the first current blocking layer. A cap layer of the second conductivity type for facilitating the formation of an electrode is formed on the second semiconductor layer. And, a recess, preferably a hole, is formed in the second semiconductor layer and the recess has a side wall which extends in a direction substantially perpendicular to the main surface. The bottom of the recess extends into the first semiconductor layer. And, an impurity material of the first conductivity type is diffused into the structure through the side wall of the recess so that a diffusion region of the first conductivity type is formed around the recess. As a result, a light-emitting activation region is defined in the structure by a p-n junction extending substantially vertically with respect to the main surface of the substrate.

The cap layer is formed only on the second semiconductor layer of the second conductivity type and not on the diffusion region. An electrically insulating layer for preventing the occurrence of leakage current is formed on the cap layer excepting a peripheral portion of the cap layer which defines an top opening. The insulating layer thus serves as the second current blocking layer. A second conductivity type side electrode is formed on the insulating layer and also on the peripheral portion of the cap layer on which no insulating layer is formed. And, a first conductivity type side electrode is formed on the rear surface of the substrate opposite to its main surface.

With the above-described structure, when current is passed between the two electrodes, the current is injected into the activation region where electrons and holes are recombined to produce light which is then emitted substantially in a vertical direction with respect to the main surface of the substrate. It is to be noted that the substrate and each of the semiconductor layers may be comprised of the same semiconductor material with different impurity materials depending on the desired conductivity type, or they may also be formed from different semiconductor materials.

Figure 28:
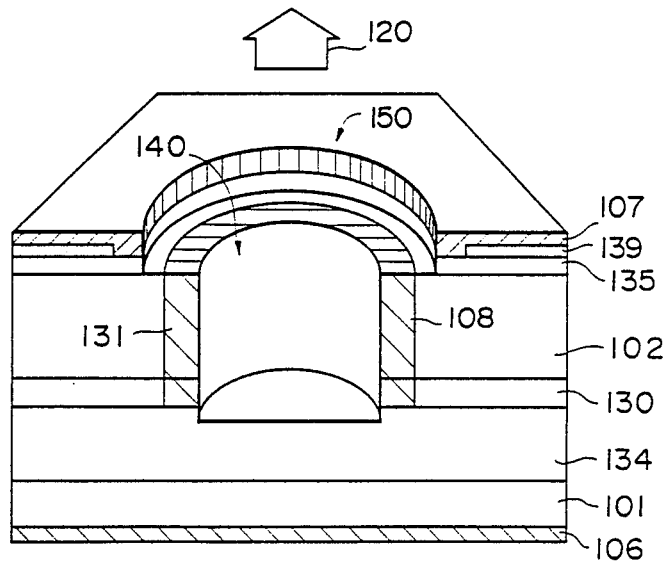

Referring now to FIG. 28, there is schematically shown a surface emission type semiconductor light-emitting device constructed in accordance with one embodiment of this aspect of the present invention. As shown, a p-type GaAs substrate 101 has a main surface on which a p-type GaAs epitaxial layer 134 is formed, and a first current blocking layer 130 comprised of electrically high resistive i-type GaAs is formed on the layer 134. And, an n-type GaAs epitaxial layer 102 is formed on the first current blocking layer 130. The n-type GaAs epitaxial layer 102 is formed with a recess 140 generally cylindrical in shape and having a side wall extending in a direction substantially perpendicular to the main surface of the substrate 101. The recess 140 has a bottom which extends into the layer 134. An impurity material such as Zn is diffused into the structure through the side wall of the recess 140 to define a p-type diffusion region 131 around the side wall of the recess 140 with its bottom extending into the layer 134. With the formation of the p-type diffusion region 131, a p-n junction which effectively defines a light-emitting activation region is defined extending substantially vertically with respect to the main surface of the substrate 101. As shown in FIG. 28, on the layer 102 is formed an n-type GaAs cap layer 135 having an opening 150 aligned in position with the recess 140.

On the cap layer 135 is formed an electrical insulating layer 139 excepting a peripheral portion of the cap layer 135 which defines the opening 150. The insulating layer 139 defines the second current blocking layer of this aspect of the present invention. An n-type side ohmic electrode 107 is formed on the insulting layer 139 and also on the exposed peripheral portion of the cap layer 135 as shown in FIG. 28. Thus, the electrode 107 is in electrical contact with the cap layer 135 only through the peripheral portion defining the top opening 150. On the other hand, a p-type side electrode 106 is formed on the bottom surface of the substrate 101 opposite its main surface.

With the above-described structure, when current is passed between the electrodes 106 and 107, the current is injected into the activation region defined by the p-n junction 108 where recombination of carriers takes place to emit light which is then led to the exterior through the top opening 150 as a light output 120 in a direction substantially vertical to the main surface of the substrate 101.

Figure 29:
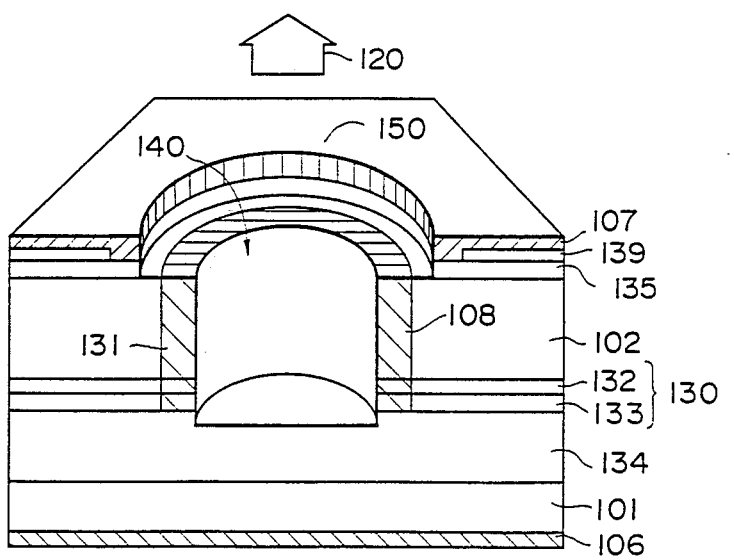

FIG. 29 illustrates another embodiment of this aspect of the present invention which may be obtained by modifying the structure shown in FIG. 28. For example, the structure shown in FIG. 29 may be obtained by replacing the current blocking layer 130 of i-type GaAs in FIG. 28 by a current blocking layer 130 including a pair of p-type GaAs layer 132 and an n-type GaAs layer 133. In this embodiment, when the device is forwardly biased, a reverse-biased condition is established inside of the current blocking layer 130 to effectively block the passage of current therethrough.

Figure 30:
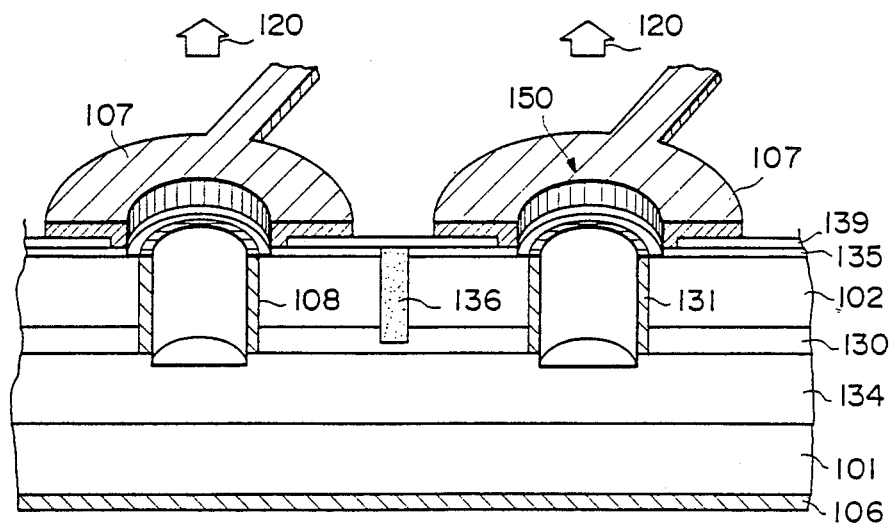
FIG. 30 is a schematic illustration showing in cross section a semiconductor light-emitting device when constructed in the form of a two-dimensional array using the structure shown in FIG. 28.
Figure 31:
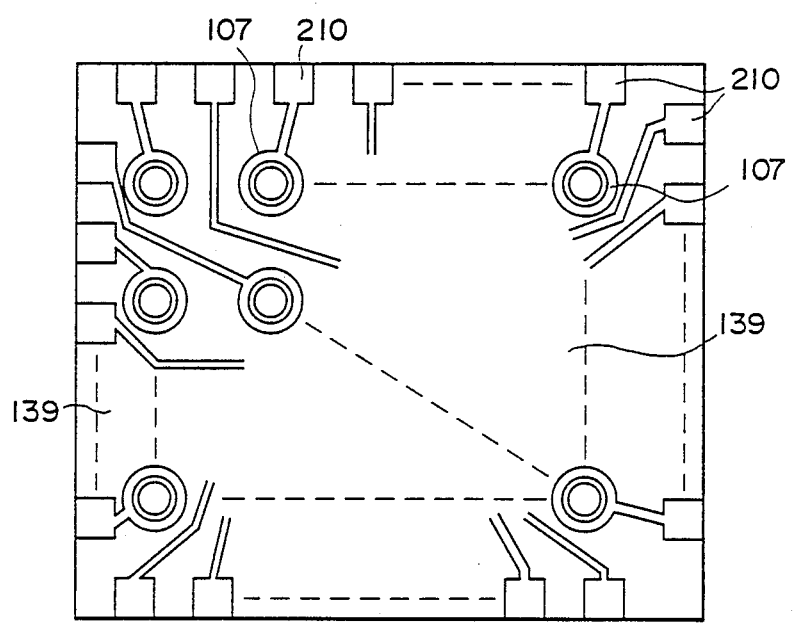
FIG. 31 is a schematic illustration showing the plan view of the structure shown in FIG. 30.

Referring now to FIGS. 30 and 31, there is schematically shown a two-dimensional array semiconductor light-emitting device constructed by using the structure shown in FIG. 28. In the structure shown in FIGS. 30 and 31, a plurality of light-emitting elements each having the structure shown in FIG. 28 are arranged in the form of a two-dimensional array including k rows and j columns. As shown in FIG. 30, in the illustrated structure, a high electrical resistive layer 136 is formed between the two adjacent elements to provide an electrical isolation to each of the plurality of light-emitting elements. The highly electrical resistive layer 136 extends vertically downward from the bottom of the insulating layer 139 toward the substrate 101 through the cap layer 135 and the n-type GaAs epitaxial layer 102 terminating in the first current blocking layer 130 of i-type GaAs. In addition, the n-type GaAS cap layer 135 and the n-type side electrode 107 are also subdivided and electrically isolated to define individual electrodes 107 one for each light-emitting element. Each of the individual electrodes 107 is electrically connected to a corresponding terminal electrode 210 for wiring. On the other hand, the p-type side electrode 106 is formed as a common electrode common to all of the light-emitting elements.

With the above-described structure, by passing current between the common electrode 106 and any one or more of the individual electrodes 107 selectively, one or more of the plurality of light-emitting elements may be activated selectively to emit light in a direction substantially perpendicular to the main surface of the substrate 101. It is to be noted that the present two-dimensional array device may be constructed using any of the previously described embodiments other than the one shown in FIG. 28. For example, the structure shown in FIG. 29 may be advantageously applied to construct the present two-dimensional array structure.

It is to be noted that for any of the embodiments shown in FIGS. 28 through 31 and describe above, the substrate 101 may be formed from a material such as InP, GaP or GaAsP other than GaAS described above. And, one or more of the layers defining the current blocking layer 130 may also be formed from a material such as GaAsP, AlGaAs, InGaAsP, AlGaInP, GaP, InP or InGaP other than GaAs described above. Besides, the light-emitting epitaxial layer 102 including a light-emitting activation region may be formed from such a material as GaAsP, AlGaAs, InGaAsP, AlGaInP, GaP, InP or InGaP other than GaAs described above. In addition, the insulating layer 139 may be formed from such a material as silicon oxide, silicon nitride, aluminum oxide, aluminum nitride, i-type GaAs or amorphous silicon.

As described above, in any of the embodiments shown in FIGS. 28 through 31 and described above, the first current blocking layer 130 is provided substantially in parallel with the main surface of the substrate 101 and yet the insulating layer 139 as the second current blocking layer is formed between the cap layer 135 and the n-type side electrode 107 excepting a peripheral portion which defines the top opening 150. As a result, the leakage current which does not participate in emission of light is minimized and thus current is efficiently and effectively injected into the activation region.

In accordance with a still further aspect of the present invention, there is provided a surface emission type semiconductor light-emitting device which comprises a substrate having a main surface, a light-emitting semiconductor layer including a light-emitting activation region, preferably defined by a p-n junction, capable of emitting light in a direction substantially perpendicular to the main surface, an electrode means for introducing current into the light-emitting semiconductor layer, a pair of top and bottom current confinement layers formed to sandwich the light-emitting semiconductor layer, and a recess, preferably a hole, extending at least through the light-emitting semiconductor layer and the pair of current confinement layers and having a side wall extending in a direction substantially vertical to the main surface of the substrate.

In the preferred embodiment of this aspect of the present invention, the p-n junction is defined around the recess or hole and located adjacent to the side wall thereof. A current blocking layer is also provided underlying the bottom current confinement layer so as to block the flow of current excepting the light-emitting activation region so as to cause the current to be injected into the activation region.

In one embodiment of this aspect of the present invention, a semiconductor light-emitting device includes a semiconductor substrate of a first conductivity type having a main surface on which a current blocking layer comprised of a single layer or a plurality of layers is formed. On the current blocking layer is formed a semiconductor layer of a second conductivity type having at least three layers, and a cap layer of the second conductivity type for facilitating the formation of an electrode thereon is formed on the semiconductor layer. The semiconductor layer of the second conductivity type includes three sub-layers and the top and bottom sandwiching sub-layers have a larger energy gap while the intermediate and sandwiched sub-layer has a smaller energy gap. Thus, the top and bottom sub-layers effectively define a current confinement structure to have the current confined within the intermediate sub-layer. Each of the top and bottom sub-layers has a thickness equal to or larger than approximately 30 nm and thus the thickness is not equal to ¼ of the wavelength of the emitted light within the layer.

A recess or hole is formed in the semiconductor layer extending substantially perpendicular to the main surface of the underlying substrate with the bottom of the recess or hole extending into the substrate. An impurity material of the first conductivity type is diffused into the structure through the side wall of the recess or hole to define a diffusion region of the first conductivity type around the recess or hole so that a p-n junction is formed around and adjacent to the side wall of the recess or hole with its bottom extending into the substrate. The resulting p-n junction effectively defines a light-emitting activation region within the semiconductor layer. The cap layer is formed only on the second conductivity type portion of the semiconductor layer and not on the diffusion region which is of the first conductivity type. And, a second conductivity type side electrode is formed on the cap layer; whereas, a first conductivity type side electrode is formed on the back surface of the substrate opposite to its main surface.

With the above-described structure, when the device is forwardly biased, current is caused to flow between the electrodes whereby the current is positively injected into the activation region to emit light which is output in a direction substantially vertical to the main surface of the substrate. In this case, because of the provision of a current confinement structure, the current tends to stay within the intermediate semiconductor sub-layer to thereby provide an increased chance of recombination between holes and electrons so that there is provided an enhanced light output.

Figure 32:
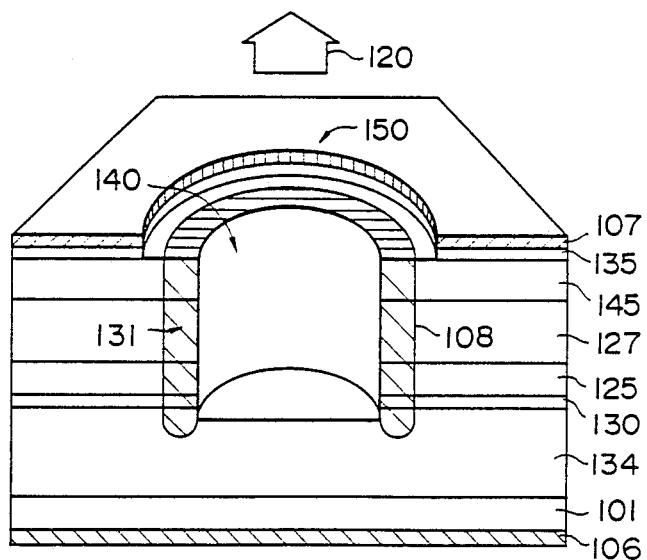
FIGS. 32 through 35 are schematic illustrations showing in cross section a number of embodiments of a semiconductor light-emitting device constructed in accordance with a still further aspect of the present invention.

Referring now to FIG. 32, there is schematically shown a surface emission type semiconductor light-emitting device constructed in accordance with one embodiment of this aspect of the present invention. As shown, the illustrated device includes a p-type GaAs substrate 101 having a main surface on which a p-type AlGaAs epitaxial layer 134 is formed. And a current blocking layer 130 of i-type GaAs is formed on the layer 134, and on the current blocking layer 130 is formed an n-type AlGaAs layer 125, an n-type GaAs layer 127 and an n-type AlGaAs layer 145 one on top of another in the order mentioned. And, an n-type GaAs cap layer 135 is formed on the layer 145. A recess or hole 140 is formed to extend through the semiconductor layers 145, 127, and 125 and also through the current blocking layer 130 to reach the layer 134. The recess 140 has a side wall which extends in a direction substantially vertical to the main surface of the substrate 101. The cap layer 135 is provided with an opening 150 which is somewhat larger than the size of the recess or hole 140.

A selected impurity material, e.g., Zn, is diffused into the structure through the side wall of the recess or hole 140, so that a p-type diffusion region 131 is formed around the recess 140 with its bottom extending into the layer 134. With the provision of the p-type diffusion region 131 around the hole 140, a p-n junction 108 is defined between the p-type diffusion region 131 and the body of the n-type semiconductor layer including layers 125, 127 and 145. The p-n junction is thus cylindrical in shape and extends in a direction substantially vertical to the main surface of the substrate 101. It is to be noted that the cap layer 135 is formed on the n-type portion of the layer 145 and not on the p-type diffusion region 131. As shown in FIG. 32, on the cap layer 135 is formed an n-type side electrode 107 provided with an opening 150 in registry in position with the recess 140. On the other hand, a p-type side electrode 106 is formed on the back surface of the substrate 101 opposite to its main surface.

With the above-described structure, when current is passed between the two electrodes 106 and 107 while forwardly biasing the present device, the current is injected into the activation region to emit light which is then taken out as a light output 120 through the opening 150 in a direction substantially perpendicular to the main surface of the substrate 101. In the present embodiment, the operation may be controlled independently of the carrier density in each of the substrate 101 and the layer 134. Moreover, since the layer 127 is sandwiched between the two sandwiching layers 125 and 145 which have a larger energy gap than that of the sandwiched layer 127, both of the sandwiching layers 125 and 145 serve as current confining layers to have the current confined in the sandwiched layer 127. As a result, the injected current tends to stay in the sandwiched layer 127 to effect recombination of carriers in that portion of the p-n junction 108 efficiently. In this structure, both of the sandwiching layers 125 and 145 have a thickness which is equal to or larger than approximately 30 nm and which is not equal to ¼ of the wavelength of emitted light within each of these layers. It is to be noted that the p-type AlGaAs epitaxial layer 134 may also be formed as a p-type GaAs epitaxial layer, if desired.

Figure 33:
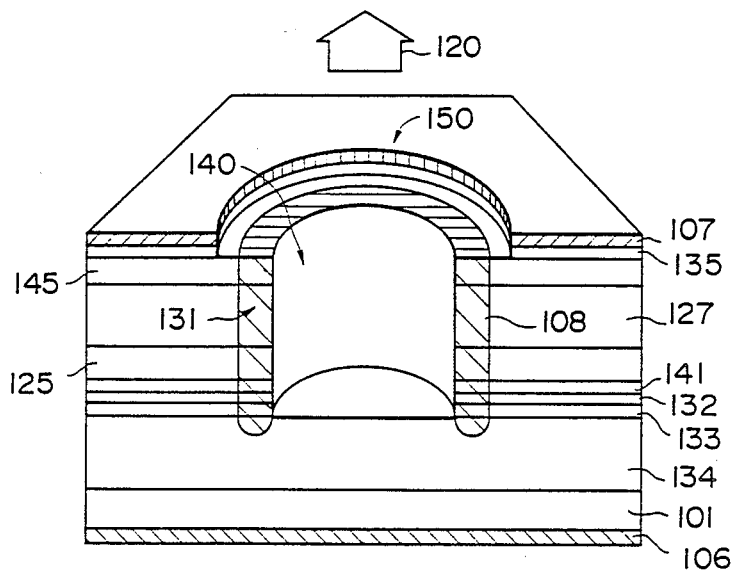

FIG. 33 illustrates another embodiment of this aspect of the present invention, which may be obtained by modifying the structure shown in FIG. 32. That is, the structure shown in FIG. 33 may be obtained by replacing the i-type GaAs layer 130 of the embodiment shown in FIG. 32 by a three-layer-structured current blocking layer including a p-type GaAS layer 132, an n-type GaAs layer 133 and a p-type AlGaAs layer 141. In the present embodiment, since the current blocking layer have such a three-layer structure, a reverse-biased condition is established therein when the device is forwardly biased to thereby provide an excellent current blocking function. It is to be noted that in the embodiments shown in FIGS. 32 and 33 the layer 127 may be formed from n-type AlGaAs which has an energy gap smaller than that of n-type AlGaAs which is used to from the pair of sandwiching layers 125 and 145. In this alternative structure, since the energy gap of AlGaAs is larger than that of GaAs, emitted light has a shorter wavelength.

Figure 34:
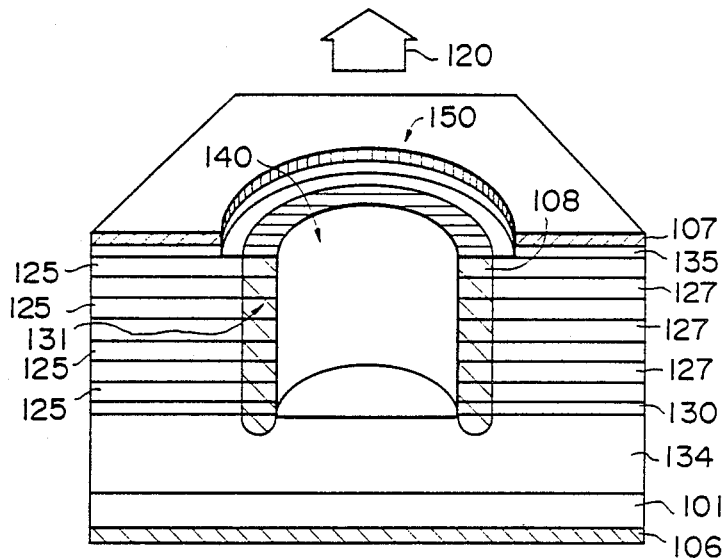

FIG. 34 illustrates another embodiment of this aspect of the present invention, which may be obtained by modifying the structure shown in FIG. 32. That is, the device shown in FIG. 34 includes a p-type GaAs substrate 101 having a main surface on which a p-type AlGaAs epitaxial layer 134 is formed. On the layer 134 is formed a current blocking layer 130 of i-type GaAs, and a multi-layer semiconductor structure including an alternate arrangement of an n-type GaAs layer 127 and an n-type AlGaAs layer 125 is formed on the current blocking layer 130. And, an n-type GaAs cap layer 135 is formed on the multi-layer structure. The multi-layer semiconductor structure is formed with a recess or hole 140 having a side wall extending substantially in a direction perpendicular to the main surface of the substrate 101 and having a bottom which extends into the layer 134.

An impurity material, such as Zn, is diffused into the multi-layer semiconductor structure through the side wall of the recess 10 and a p-type diffusion region 131 is formed in the multi-layer semiconductor structure around the recess or hole 140. The p-type diffusion region 140 is generally cylindrical in shape and its bottom extends into the layer 134. With the provision of the diffusion region 131, a p-n junction 108 is formed around and adjacent to the side wall of the recess or hole 140 and the p-n junction 108 effectively defines a light-emitting activation region where recombination of electrons and holes takes place to emit light. Since the p-n junction 108 extends vertically, the activation region is also elongated vertically and thus the light emitted is output in the vertical direction.

The cap layer 135 is formed only on the n-type portion of the multi-layer semiconductor structure and not on the diffusion region 131, and thus the cap layer 135 is formed with an opening 150 through which the emitted light may be output. On the cap layer 135 is formed an n-type side electrode 107 which is also provided with an opening 150 in registry in position with the recess or hole 140. On the other hand, a p-type side electrode 106 is formed on the back surface of the substrate 101.

With the above-described structure, there is provided a multi-layer semiconductor structure which is formed by an alternate arrangement of the n-type GaAs layer 127 and the n-type AlGaAs layer 125. Since the n-type AlGaAs layer 125 has an energy gap which is smaller than that of the n-type GaAs layer 127, a plurality of n-type AlGaAs layers 125 in this structure serve as current confining layers. Thus, when the device is forwardly biased by applying a suitable voltage between the two electrodes 106 and 107, the current tends to be confined in a plurality of n-type GaAs layers 127 and recombination takes place mostly at the corresponding portions of the p-n junction 108. Therefore, light is emitted in the vertical direction and output through the opening 150 as a light output 120. It is to be noted that each of the layers 125 and 127 has a thickness which is equal to or larger than approximately 30 nm and which is not equal to $\frac{1}{4}$ of the wavelength of the emitted light within each of the layers. Because of the provision of a current confinement structure, the light-emitting operation may be carried out independently of the carrier density in each of the substrate 101 and the layer 134. It should also be noted that the p-type AlGaAs epitaxial layer 134 formed on the substrate 101 may be replaced by a p-type GaAs epitaxial layer.

Figure 35:
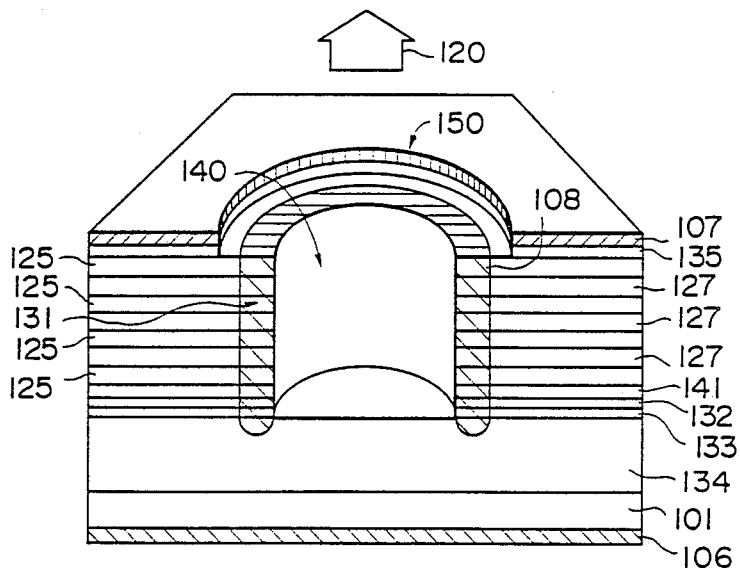
Figure 36:
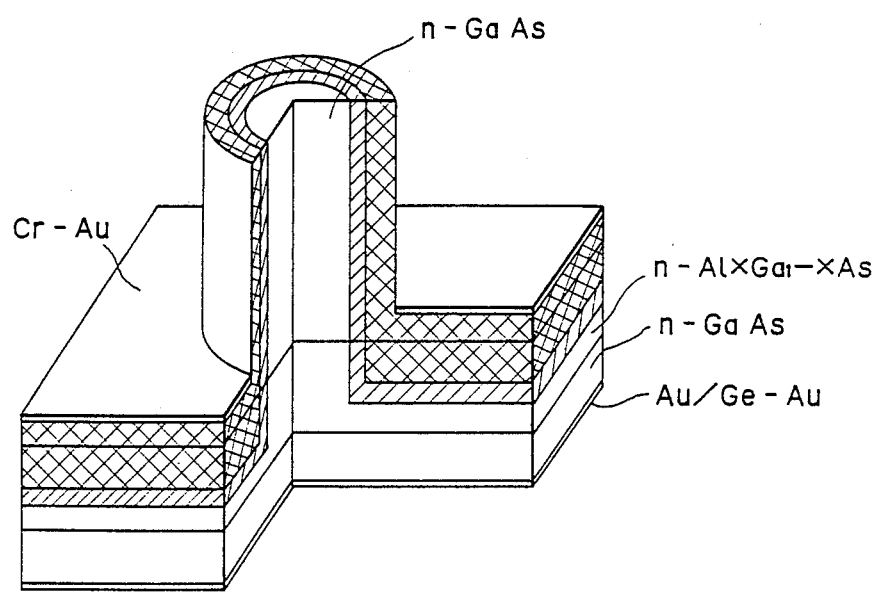
FIGS. 36 through 38 are schematic illustrations showing a few examples of the prior art semiconductor light-emitting device.
Figure 37:
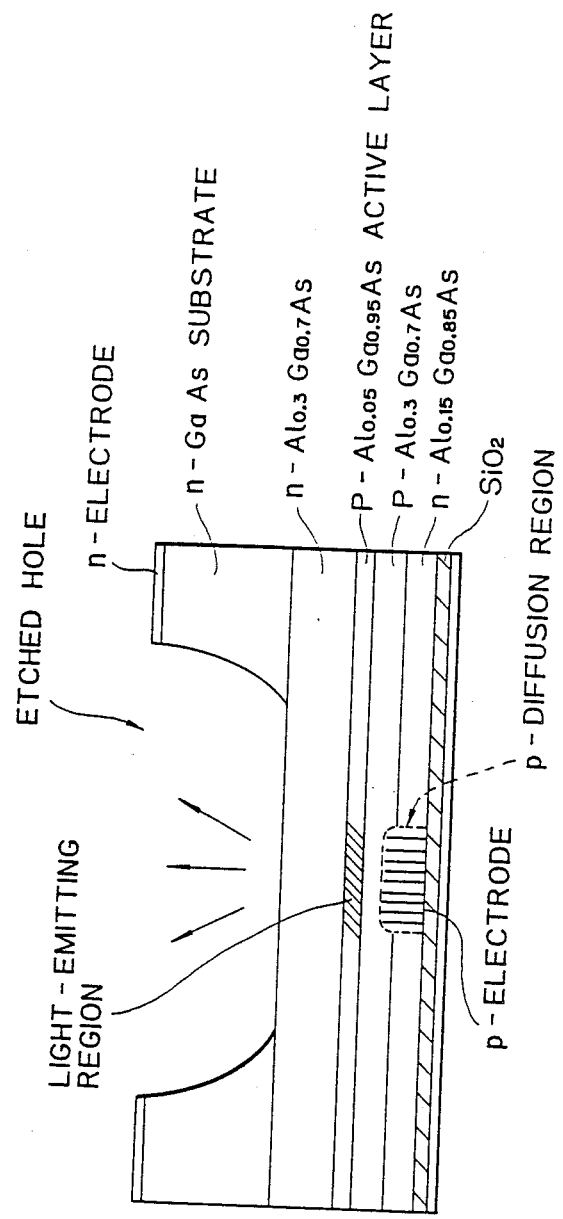
Figure 38:
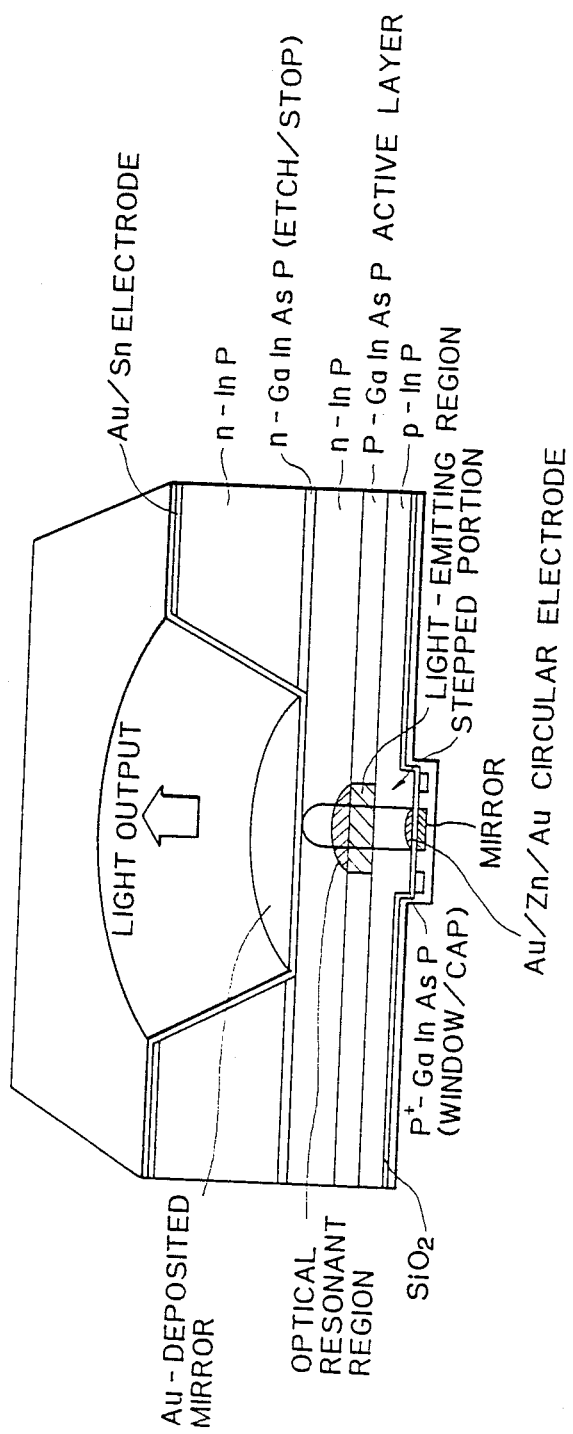

FIG. 35 illustrates a further embodiment of this aspect of the present invention, which may be obtained by modifying the structure shown in FIG. 34. That is, the structure shown in FIG. 35 may be obtained by replacing the current blocking i-type GaAs layer 130 of the embodiment shown in FIG. 34 by a current blocking layer having three layers, i.e., p-type GaAs layer 132, n-type GaAs layer 133 and p-type AlGaAs layer 141. As described previously, in the present embodiment, when the device is forwardly biased, a reverse-biased condition is established in the current blocking layer to effectively block the passage of current therethrough. It should also be noted that in the embodiments shown in FIGS. 34 and 35 and described above, the n-type GaAs layer 127 may be replaced by an n-type AlGaAs layer which has an energy gap smaller than that of the n-type AlGaAs layer 125. In this alternative structure, since AlGaAs is larger in energy gap than GaAs, there is obtained emitted light having a shorter wavelength.

In the embodiments shown in FIGS. 32 through 35 and described above, the substrate 101 may be formed from any other material such as InP, GaP, or GaAsP than GaAs described above. Besides, the p-type epitaxial layer 134 formed on the substrate 101 may be formed from such a material as GaAsP, InGaAsP, AlGaInP, GaP, InP, or InGaP other than GaAs described above. In addition, the current blocking layer 130 may also be formed from such a material as AlGaAs, GaAsP, InGaAsP, AlGaInP, GaP, InP or InGaP other than GaAs described above. Furthermore, the n-type GaAs layer 127 may be formed from such a material as GaAsP, AlGaAs, InGaAsP, AlGaInP, GaP, InP or InGaP other than GaAs. The AlGaAs layers 125 and 145 defining as current confining layers may be formed from such a material as GaAsP, InGaAsP, AlGaInP, GaP, GaAs, InP or InGa other than AlGaAs described above.

It should also be noted that the recess or hole 140 may be formed by any desired method and one preferred example is to use etching, most preferably dry etching using chlorine-containing plasma. It should also be noted that the recess or hole 140 should be limited only to any particular shape, though it is typically formed cylindrically, in which case the cross section has a circular shape. The recess or hole 140 may take any other desired shape and thus its cross sectional shape may take any desired shape, such as rectangular or polygonal.

As described in detail above, in accordance with various embodiments of the present invention shown in FIGS. 1 through 35 and described above, a recess or hole is formed extending substantially vertically and an activation region, which is preferably defined by a p-n junction, extends in the vertical direction located around and in the vicinity of the recess or hole. And, thus, there is obtained an light output at high intensity in the vertical direction with respect to a major plane of the device. In addition, since the activation region is located closer to the recess or hole, there is provided an enhanced heat dissipation effect. This is advantageous in keeping the activation region at low temperature and maintaining a stable light-emitting operation. Furthermore, in accordance with the present invention, the above-described structure is added with one or more of the additional features of provision of current blocking layer 135, the provision of current narrowing region 138, the provision of an electrically insulating layer 139 and the provision of a current confinement structure. Therefore, when the device is forwardly biased to flow current between the pair of electrodes, the current is effectively and efficiently injected into the activation region, so that there is obtained a light output high in intensity even in the vertical direction with respect to the main surface of the substrate.

While the above provides a full and complete disclosure of the preferred embodiments of the present invention, various modification, alternate constructions and equivalents may be employed without departing from the true spirit and scope of the invention. Therefore, the above description and illustration should not be construed as limiting the scope of the invention, which is defined by the appended claims.

What is claimed is:

1. A semiconductor light-emitting device comprising:
a substrate having a main surface;
a current blocking layer formed on said main surface;
a semiconductor layer formed on said current blocking layer, said semiconductor layer being formed with a recess having a side wall extending substantially perpendicularly to said main surface and a bottom extending into said substrate, said semiconductor layer including a light-emitting activation region formed by a p-n junction around said recess and capable of emitting light in a direction substantially perpendicular to said main surface, and
means for injecting current into said activation region.

2. The device of claim 1 wherein said substrate has a first conductivity type and said semiconductor layer has a second conductivity type opposite to said first conductivity type.

3. The device of claim 2 further comprising a diffusion region formed around said recess, said diffusion region extending through said semiconductor layer and said current blocking layer into said substrate, whereby said diffusion region has said first conductivity type so that a p-n junction is defined around and along said side wall of said recess, said p-n junction defining said activation region.

4. The device of claim 2 wherein said current blocking layer includes an intrinsic semiconductor layer having a high electrical resistance.

5. The device of claim 2 wherein said current blocking layer includes a pair of upper and lower sub-layers, said lower sub-layer having the second conductivity type and being formed on said substrate and said upper sub-layer having the first conductivity type and being formed on said lower sub-layer, whereby a reverse-biased condition is established between the upper and lower sub-layers when the device is forwardly biased.

6. The device of claim 1 wherein said means for injecting includes a first electrode formed on said semiconductor layer and a second electrode formed on a back surface of said substrate opposite to said main surface.

7. The device of claim 6 wherein said first electrode is formed with an opening located in alignment with said recess, whereby light emitted is output through said opening vertically with respect to said main surface.

8. The device of claim 1 wherein said recess is substantially cylindrical in shape.

9. A semiconductor light-emitting device comprising:
a substrate having a main surface;
a first semiconductor layer formed on said main surface;
a current blocking layer formed on said first semiconductor layer;
a second semiconductor layer formed on said current blocking layer, said second semiconductor layer being formed with a recess having a side wall extending substantially perpendicularly to said main surface and a bottom extending into said first semiconductor layer, said second semiconductor layer including a light-emitting activation region formed by a p-n junction around said recess and capable of emitting light in a direction substantially perpendicular to said main surface, and
means for injecting current into said activation region.

10. The device of claim 9 wherein said substrate and said first semiconductor layer each has a first conductivity type and said second semiconductor layer has a second conductivity type opposite to said first conductivity type.

11. The device of claim 10 further comprising a diffusion region formed around said recess, said diffusion region extending through said second semiconductor layer and said current blocking layer into said first semiconductor layer, whereby said diffusion region has said first conductivity type so that a p-n junction is defined around and along said side wall of said recess, said p-n junction defining said activation region.

12. The device of claim 10 wherein said current blocking layer includes an intrinsic semiconductor layer having a high electrical resistance.

13. The device of claim 10 wherein said current blocking layer includes a pair of upper and lower sub-layers, said lower sub-layer having the second conductivity type and being formed on said first semiconductor layer and said upper sub-layer having the first conductivity type and being formed on said lower sub-layer, whereby a reverse-biased condition is established between the upper and lower sub-layers when the device is forwardly biased.

14. The device of claim 9 wherein said means for injecting includes a first electrode formed above said second semiconductor layer and a second electrode formed on a back surface of said substrate opposite to said main surface.

15. The device of claim 14 wherein said first electrode is formed with an opening located in alignment with said recess, whereby light emitted is output through said opening vertically with respect to said main surface.

16. The device of claim 9 wherein said recess is substantially cylindrical in shape.

17. The device of claim 15 further comprising a cap layer formed between said second semiconductor layer and said first electrode, said cap layer being formed with an opening aligned with said recess.

18. The device of claim 9 wherein said second semiconductor layer includes n-type GaAs.

19. The device of claim 9 wherein said second semiconductor layer includes n-type AlGaAs.

20. The device of claim 9 wherein said second semiconductor layer has a multi-layer structure including an alternate arrangement of a GaAs layer and an AlGaAs layer one on top of another.

21. The device of claim 20 wherein each of said layers defining said multi-layer structure has a thickness substantially equal to ¼ of a wavelength of light emitted in the same material.

22. The device of claim 20 wherein each of said layers defining said multi-layer structure has a thickness less than approximately 30 nm.

23. The device of claim 9 wherein said substrate is formed with an additional opening substantially in alignment with said recess whereby light emitted from said activation region may also be output through said additional opening.

24. The device of claim 9 further comprising a pair of first and second light reflecting layers sandwiching said second semiconductor layer, whereby said pair of first and second light reflecting layers provide an optical resonant structure for laser action.

25. The device of claim 24 wherein each of said first and second light reflecting layers includes a multi-layer structure.

26. The device of claim 25 wherein said multi-layer structure includes an alternate arrangement of a first layer having a first energy gap and a second layer having a second energy gap which is different from said first energy gap.

27. The device of claim 26 wherein said first and second layers are comprised of different semiconductor materials.

28. The device of claim 26 wherein said first and second layers are comprised of the same semiconductor materials.

29. The device of claim 24 wherein said substrate is formed with a bottom opening in alignment with said recess and one of said pair of first and second light reflecting layer is located within said bottom opening and at a bottom end of said recess.

30. The device of claim 24 wherein one of said first and second light reflecting layers is substantially annular in shape and located at top of said recess.

31. The device of claim 9 wherein said recess is filled with a material having a relatively high thermal conductivity.

32. The device of claim 31 wherein said filling material include a lens portion having a focusing action located at a top thereof, whereby light emitted from said activation region is made convergent in a predetermined direction when output through said lens portion in said vertical direction.

33. A semiconductor light-emitting device comprising:
 a base having a main surface;
 a current blocking layer formed on said base;
 a semiconductor layer formed on said current blocking layer, said semiconductor layer being formed with a recess extending therethrough and into said base and having a side wall extending substantially perpendicularly to said main surface and with a light-emitting activation region defined by a p-n junction around said recess;
 current path narrowing means formed in said semiconductor layer for narrowing a current path defined in said semiconductor layer when said device is forwardly biased to thereby cause current to be injected into said activation region as much as possible; and
 means for introducing current into said semiconductor layer.

34. The device of claim 33 wherein said semiconductor layer is formed with a first diffusion region around said recess by introducing an impurity material through said side wall, whereby a p-n junction is defined at a boundary of said diffusion region, said p-n junction effectively defining said light-emitting activation region.

35. The device of claim 34 wherein said current path narrowing means includes a second diffusion region formed in said semiconductor layer separated away from said first diffusion region over a predetermined distance and said second diffusion region extends into said semiconductor layer from a top surface thereof and terminates short of said current blocking layer.

36. The device of claim 33 wherein said base includes a substrate having a top surface which defines said main surface.

37. The device of claim 36 wherein said base further includes an epitaxial layer formed on said main surface of said substrate and said current blocking layer is formed on said epitaxial layer.

38. A semiconductor light-emitting device comprising:
 a base having a main surface;
 a first current blocking layer formed on said base;
 a semiconductor layer formed on said first current blocking layer, said semiconductor layer being formed with a recess extending therethrough and into said base and having a side wall extending substantially perpendicularly to said main surface and with a light-emitting activation region defined by a p-n junction around said recess;
 a second current blocking layer formed on a predetermined portion of said semiconductor layer; and
 means for introducing current into said semiconductor layer.

39. The device of claim 38 wherein said semiconductor layer is formed with a first diffusion region around said recess by introducing an impurity material through said side wall, whereby a p-n junction is defined at a boundary of said diffusion region, said p-n junction effectively defining said light-emitting activation region.

40. The device of claim 38 wherein said base includes a substrate having a top surface which defines said main surface.

41. The device of claim 40 wherein said base further includes an epitaxial layer formed on said main surface of said substrate and said first current blocking layer is formed on said epitaxial layer.

42. The device of claim 38 wherein said second current blocking layer includes an electrically insulating layer.

43. A semiconductor light-emitting device comprising:
 a base having a main surface;
 a current blocking layer formed on said base;
 a semiconductor layer formed on said current blocking layer, said semiconductor layer being formed with a recess extending therethrough and having a side wall extending in a direction substantially perpendicular to said main surface, said semiconductor layer being formed with a light-emitting activation region by a p-n junction around said side wall, said semiconductor layer having a multi-layer structure including at least one first layer having a first energy gap and at least two second layers sandwiching said first layer and having a second energy gap which is larger than said first energy gap; and means for introducing current into said semiconductor layer.

44. The device of claim 43 wherein said semiconductor layer is formed with a diffusion region by introducing an impurity material into said semiconductor layer through said side wall, whereby an outer boundary of said diffusion region defines a p-n junction which in turn effectively defines said light-emitting activation region.

45. The device of claim 43 wherein said base further includes an epitaxial layer formed on said main surface of said substrate and said first current blocking layer is formed on said epitaxial layer.

46. The device of claim 43 wherein said current blocking layer includes an electrically insulating layer.

* * * * *

UNITED STATES PATENT AND TRADEMARK OFFICE
CERTIFICATE OF CORRECTION

PATENT NO. : 4,897,846
DATED : 01/30/1990
INVENTOR(S) : Tomoaki Yoshida, et al.

It is certified that error appears in the above-identified patent and that said Letters Patent is hereby corrected as shown below:

On the title page, item (73) the Assignee should read --Mitsubishi Cable Industries, Ltd., Amagasaki-shi: Ricoh Company, Ltd., Tokyo: Ricoh Research Institute of General Electronics, Miyagi-ken, all of Japan--

Signed and Sealed this

Twenty-fifth Day of February, 1992

Attest:

HARRY F. MANBECK, JR.

*Attesting Officer*

*Commissioner of Patents and Trademarks*